(12) United States Patent
Watanabe et al.

(10) Patent No.: US 9,252,279 B2
(45) Date of Patent: Feb. 2, 2016

(54) SEMICONDUCTOR DEVICE AND MANUFACTURING METHOD THEREOF

(75) Inventors: Masahiro Watanabe, Tochigi (JP); Mitsuo Mashiyama, Oyama (JP); Takuya Handa, Tochigi (JP); Kenichi Okazaki, Tochigi (JP)

(73) Assignee: Semiconductor Energy Laboratory Co., Ltd., Atsugi-shi, Kanagawaken (JP)

( * ) Notice: Subject to any disclaimer, the term of this patent is extended or adjusted under 35 U.S.C. 154(b) by 432 days.

(21) Appl. No.: 13/592,870

(22) Filed: Aug. 23, 2012

(65) Prior Publication Data

US 2013/0048977 A1  Feb. 28, 2013

(30) Foreign Application Priority Data

Aug. 31, 2011 (JP) ................................ 2011-189717

(51) Int. Cl.
*H01L 29/786* (2006.01)

(52) U.S. Cl.
CPC ...... *H01L 29/78606* (2013.01); *H01L 29/7869* (2013.01)

(58) Field of Classification Search
CPC ............................ H01L 33/00; H01L 29/7869
USPC ................ 257/43, E29.296, E21.476, 59, 66; 438/158
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Kenneth Parker
*Assistant Examiner* — Young W Kim
(74) *Attorney, Agent, or Firm* — Eric J. Robinson; Robinson Intellectual Property Law Office, P.C.

(57) ABSTRACT

To provide a semiconductor device including an oxide semiconductor, which has stable electric characteristics and has high reliability. To provide a method for manufacturing the semiconductor device. The semiconductor device includes a gate electrode, a gate insulating film formed over the gate electrode, an oxide semiconductor film formed over the gate insulating film, a source electrode and a drain electrode formed over the oxide semiconductor film, and a protective film. The protective film includes a metal oxide film, and the metal oxide film has a film density of higher than or equal to 3.2 g/cm$^3$.

11 Claims, 14 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1* | 3/2007 | Akimoto et al. ............ 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0295041 A1 | 11/2010 | Kumomi et al. |
| 2011/0089425 A1* | 4/2011 | Ichijo et al. ............... 257/66 |
| 2011/0095288 A1 | 4/2011 | Morosawa et al. |
| 2011/0175090 A1 | 7/2011 | Sugihara et al. |
| 2011/0180802 A1* | 7/2011 | Morosawa et al. ............ 257/59 |
| 2012/0132908 A1 | 5/2012 | Sugihara et al. |
| 2013/0043466 A1 | 2/2013 | Nomura et al. |
| 2013/0048977 A1* | 2/2013 | Watanabe et al. ............ 257/43 |
| 2013/0208207 A1* | 8/2013 | Okamoto et al. ............ 349/46 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086060 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2006-165528 A | 6/2006 |
| JP | 2006-229185 A | 8/2006 |
| JP | 2010-016163 | 1/2010 |
| JP | 2010-114413 A | 5/2010 |
| WO | WO-2004/114391 | 12/2004 |
| WO | WO 2010/041686 | 4/2010 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-SILiCON Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of sol-gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3—In2O3—ZnO) TFT,", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et at "60.2: Intermediate Connector With Suppressed Voltage Loss for White Tandem OLEDs,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employees MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID Internatioanl Symposium Digest of Technical Papers, May 20, 2008, vol. 39, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:AL and Sn-Doped Zinc Indium Oxide Thin Film Transistors for AMOLED Back-Plane,", SID Digest '09: SID International Syposium Digest of Technical Papers, May 31, 2009, pp. 280-283.

Lee.M et al., "15.4:Excellent Performance of Indium-Oxide-Based Thin-Film Transistors by DC Sputting,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09: SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09: Proceedings of the 16th International Display Workshops, 2009, pp. 689-692.

Park.J et al., "Amorphous Indium-Gallium-Zinc Oxide TFTs and their application for large size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09: SID International Symposium Digest of Eng.Technical Papers, May 31, 2009, pp. 1110-1112.

Ohara.H et al., "21.3:4.0 IN. QVGA AMOLED Display Using In—Ga—Zn—Oxide TFTs With a Novel Passivation Layer,", SID Digest '09: SID International Symposium Digest of Technical Papers, May 31, 2009, pp. 284-287.

Miyasaka.M, "Suftla Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Compositions for Display Applications,", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09: SID International Symposium Digest of Technical Papers, May 31, 2009, pp. 395-398.

Lee.H et al., "Current Status of, Challenges to, and Perspective View of AM-OLED ,", IDW '06: Proceeding of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in The In2O3 and Sc2O3—A2O3—BO Systems [A;Fe, Ga, or Al; B: Mg, Mn, Fe, Ni, Cu or Zn] at Temperature Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar, 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

In this specification, a semiconductor device generally means any device which can function by utilizing semiconductor characteristics, and an electro-optic device, a semiconductor circuit, and an electronic appliance are all included in the category of the semiconductor device.

2. Description of the Related Art

A technique by which transistors are formed using semiconductor thin films formed over a substrate having an insulating surface has attracted attention. The transistor is applied to a wide range of electronic devices such as an integrated circuit (IC) and an image display device (display device). A silicon-based semiconductor material is widely known as a material for a semiconductor thin film applicable to the transistor; in addition, an oxide semiconductor has attracted attention as another material.

For example, a transistor whose semiconductor thin film includes an amorphous oxide containing indium (In), gallium (Ga), and zinc (Zn) and having an electron carrier concentration of less than $10^{18}/cm^3$ is disclosed (for example, see Patent Document 1).

REFERENCE

Patent Document

[Patent Document 1] Japanese Published Patent Application No. 2006-165528

SUMMARY OF THE INVENTION

However, when water or hydrogen, which forms an electron donor, enters an oxide semiconductor or oxygen is released from an oxide semiconductor film in a manufacturing process of a device, the electrical conductivity of the oxide semiconductor may change. Such a phenomenon causes variation in the electric characteristics of a transistor including the oxide semiconductor.

In view of the above problems, an object is to provide a semiconductor device including an oxide semiconductor, which has stable electric characteristics and high reliability. Another object is to provide a method for manufacturing the semiconductor device.

In a semiconductor device including an oxide semiconductor film, a metal oxide film is used for a protective film in contact with the oxide semiconductor film. The metal oxide film is formed using a material including an element of the same group as that of an element other than oxygen included in the oxide semiconductor film. The metal oxide film can suppress entry and diffusion of water or hydrogen into the oxide semiconductor film. In addition, release of oxygen from the oxide semiconductor film can be suppressed. Further, with a structure in which the metal oxide film is in contact with the oxide semiconductor film, the interface between the metal oxide film and the oxide semiconductor film has extremely stable interface characteristics because the metal oxide film and the oxide semiconductor film include metal elements of the same group.

In addition, when a bottom-gate transistor is formed in the semiconductor device including the oxide semiconductor film, the film under the oxide semiconductor film is preferably a metal oxide film. Since the metal oxide film is provided in contact with the oxide semiconductor film, the interface characteristics are extremely stable, and a more excellent semiconductor device can be provided.

According to one embodiment of the present invention, a semiconductor device includes a gate electrode, a gate insulating film formed over the gate electrode, an oxide semiconductor film formed over the gate insulating film, a source electrode and a drain electrode formed over the oxide semiconductor film, a protective film formed over the oxide semiconductor film, the source electrode, and the drain electrode. The protective film is a stack in which a metal oxide film is formed over an oxide insulating film, and the metal oxide film has a film density of higher than or equal to $3.2 \text{ g/cm}^3$.

According to another embodiment of the present invention, a semiconductor device includes a gate electrode, a gate insulating film formed over the gate electrode, an oxide semiconductor film formed over the gate insulating film, a source electrode and a drain electrode formed over the oxide semiconductor film, and a protective film formed over the oxide semiconductor film, the source electrode, and the drain electrode. The protective film is a stack in which a metal oxide film is formed over an oxide insulating film. The metal oxide film is a film including aluminum oxide and has a film density of higher than or equal to $3.2 \text{ g/cm}^3$.

In the above structure, it is preferable that a conductive film be formed in contact with the metal oxide film of the protective film.

In the above structure, the conductive film preferably includes at least one of zinc oxide, indium tin oxide, titanium oxide, aluminum, and titanium.

In the above structure, the oxide semiconductor film preferably includes at least one of oxides of indium, zinc, gallium, zirconium, tin, gadolinium, titanium, and cerium.

In the above structure, it is preferable that the semiconductor device include a base insulating film under and in contact with the gate electrode, the base insulating film include a metal oxide film on a surface in contact with the gate electrode, and the film density of the metal oxide film be higher than or equal to $3.2 \text{ g/cm}^3$.

According to another embodiment of the present invention, a method for manufacturing a semiconductor device includes the following steps: forming a gate electrode; forming a gate insulating film over the gate electrode; performing heat treatment after the gate insulating film is formed; forming an oxide semiconductor film over the gate insulating film; forming a source electrode and a drain electrode over the oxide semiconductor film; and forming a protective film after the source electrode and the drain electrode are formed. The protective film is a stack in which a metal oxide film is formed over an oxide insulating film, and the metal oxide film has a film density of higher than or equal to $3.2 \text{ g/cm}^3$.

According to another embodiment of the present invention, a method for manufacturing a semiconductor device includes the following steps: forming a gate electrode; forming a gate insulating film over the gate electrode; performing heat treatment after the gate insulating film is formed; forming an oxide semiconductor film over the gate insulating film; forming a source electrode and a drain electrode over the oxide semiconductor film; and forming a protective film after the source electrode and the drain electrode are formed. The protective film is a stack in which a metal oxide film is formed over an oxide insulating film. The metal oxide film is a film including aluminum oxide or a Ga—Zn-based oxide film and has a film density of higher than or equal to $3.2 \text{ g/cm}^3$.

In the above method, a conductive film is preferably formed in contact with the metal oxide film of the protective film. The metal oxide film is preferably an aluminum oxide film or a Ga—Zn-based oxide film.

In the above method, it is preferable that a metal oxide film be formed over and in contact with the gate insulating film, and the metal oxide film have a film density of higher than or equal to 3.2 g/cm$^3$.

A semiconductor device including an oxide semiconductor, which has stable electric characteristics and high reliability, can be provided. Further, a method for manufacturing the semiconductor device can be provided.

DETAILED DESCRIPTION OF THE INVENTION

Figure 1:
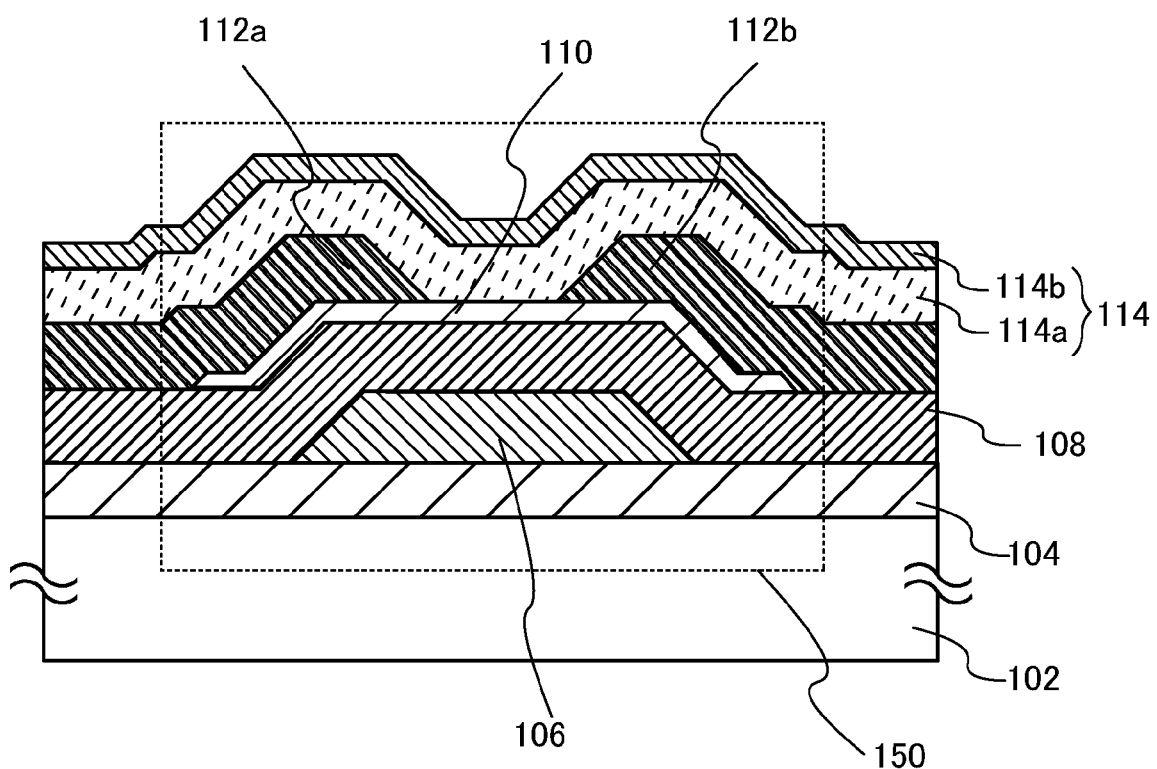
FIG. 1 illustrates a cross section of one embodiment of a semiconductor device.

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments.

Further, in the embodiments described below, the same parts are denoted with the same reference numerals throughout the drawings. Note that components illustrated in the drawings, that is, a thickness or a width of a layer, a region, or the like, a relative position, and the like are exaggerated in some cases for clarification in description of the embodiments.

In this specification and the like, ordinal numbers such as "first", "second", and "third" are used in order to avoid confusion among components, and the terms do not limit the components numerically.

In addition, in this specification and the like, the term such as "electrode" or "wiring" does not limit a function of a component. For example, an "electrode" is sometimes used as part of a "wiring", and vice versa. Further, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Thus, the terms "source" and "drain" can be replaced with each other in this specification and the like.

In this specification and the like, average surface roughness ($R_a$) is obtained by three-dimensional expansion of arithmetic mean surface roughness that is defined by JIS B 0601: 2001 (ISO4287:1997) so as to be applied to a curved surface, and is an average value of the absolute values of deviations from a reference surface to a specific surface.

When the specific surface is expressed as $Z_0$=f(x, y), the average surface roughness ($R_a$) is an average value of the absolute values of deviations from the reference surface to the specific surface and is shown by the following formula (1).

$$R_a = \frac{1}{S_0} \int_{y_1}^{y_2} \int_{x_1}^{x_2} |f(x, y) - Z_0| dx dy \tag{1}$$

Here, the specific surface is a surface which is a target of roughness measurement, and is a quadrilateral region which is specified by four points represented by the coordinates ($x_1$, $y_1$, f($x_1$, $y_1$)), ($x_1$, $y_2$, f($x_1$, $y_2$)), ($x_2$, $y_1$, f($x_2$, $y_1$)), and ($x_2$, $y_2$, f($x_2$, $y_2$)). $S_0$ represents the area of a rectangle which is obtained by projecting the specific surface on the xy plane, and $Z_0$ represents the height of the reference surface (the average height of the specific surface). The average surface roughness ($R_a$) can be measured using an atomic force microscope (AFM).

Embodiment 1

In this embodiment, a semiconductor device including a transistor according to one embodiment of the present invention and a method for manufacturing the semiconductor device will be described with reference to FIG. 1, FIGS. 2A to 2C, and FIGS. 3A and 3B.

<Structure of Semiconductor Device of Embodiment 1>

FIG. 1 is a cross-sectional view of a semiconductor device including an oxide semiconductor film. A transistor 150 in FIG. 1 includes a gate electrode 106 formed over a substrate 102 having an insulating surface over which a base insulating film 104 is provided, a gate insulating film 108 formed over the base insulating film 104 and the gate electrode 106, an oxide semiconductor film 110 formed over the gate insulating film 108, a source electrode 112a and a drain electrode 112b formed over the gate insulating film 108 and the oxide semiconductor film 110, and a protective film 114 formed over the oxide semiconductor film 110, the source electrode 112a, and the drain electrode 112b. The protective film 114 is a stack of an oxide insulating film 114a and a metal oxide film 114b.

The metal oxide film 114b is formed using a material which contains an element of Group 12 or Group 13, or an element of Group 3 having a property similar to that of the element of Group 13, which is the same group as one of the elements included in the oxide semiconductor film 110. For example, in the case where the oxide semiconductor film 110 is formed of an oxide semiconductor material including oxides of indium (In) and zinc (Zn), the metal oxide film 114b is preferably an insulating metal oxide film containing an element belonging to the same group as zinc, namely, Group 12, an element belonging to the same group as indium, namely, Group 13, or an element of Group 3 having a property similar to that of the element of Group 13. An oxide film including a lanthanoid-based element, as the element of Group 3, such as cerium (Ce) or gadolinium (Gd) may be used. As the metal oxide film 114b, an aluminum oxide film, a gallium oxide film, a zinc oxide film, or a Ga—Zn-based oxide film can be selected as a favorable example.

Further, it is preferable that an aluminum oxide film with a film density of higher than or equal to 3.2 g/cm³, preferably higher than or equal to 3.6 g/cm³ be used as the metal oxide film 114b. When the aluminum oxide film is used as the metal oxide film 114b and the film density thereof is within the above range, water or hydrogen can be prevented from entering and diffusing into the oxide semiconductor film. In addition, release of oxygen from the oxide semiconductor film can be suppressed.

<Manufacturing Method of Semiconductor Device of Embodiment 1>

A method for manufacturing the transistor 150 will be described with reference to FIGS. 2A to 2C and FIGS. 3A and 3B.

First, the base insulating film 104 is formed over the substrate 102.

For the substrate 102, a glass material such as aluminosilicate glass, aluminoborosilicate glass, or barium borosilicate glass is used. In mass production, a mother glass with the following size is preferably used for the substrate 102: the eighth generation (2160 mm×2460 mm); the ninth generation (2400 mm×2800 mm, or 2450 mm×3050 mm); the tenth generation (2950 mm×3400 mm); or the like. High process temperature and a long period of process time drastically shrink the mother glass. Thus, in the case where mass production is performed with the use of the mother glass, the preferable heating temperature in the manufacturing process is lower than or equal to 700° C., preferably lower than or equal to 450° C., more preferably lower than or equal to 350° C.

The base insulating film 104 is formed by a plasma CVD method or a sputtering method to have a thickness greater than or equal to 50 nm and less than or equal to 600 nm with the use of one of a silicon oxide film, a gallium oxide film, an aluminum oxide film, a silicon nitride film, a silicon oxynitride film, an aluminum oxynitride film, and a silicon nitride oxide film or a stack of any of these films. The base insulating film 104 can prevent entry of impurities from the substrate 102 side. In the case where the base insulating film 104 is unnecessary, e.g., in the case where the amount of moisture adsorbed on a surface of the substrate 102 and the amount of moisture included in the substrate 102 are small, the base insulating film 104 is not necessarily provided.

Further, it is preferable to provide a metal oxide film in contact with the gate electrode 106 to be formed later. In particular, it is preferable to use an aluminum oxide film with a film density of higher than or equal to 3.2 g/cm³, preferably higher than or equal to 3.6 g/cm³. The aluminum oxide film has a thickness greater than or equal to 30 nm and less than or equal to 150 nm, preferably greater than or equal to 50 nm and less than or equal to 100 nm. When the film density of the aluminum oxide film is within the above range, water or hydrogen can be prevented from entering and diffusing into the oxide semiconductor film. In addition, release of oxygen from the oxide semiconductor film can be suppressed.

Note that in this specification, "oxynitride" such as silicon oxynitride contains more oxygen than nitrogen.

Further, in this specification, "nitride oxide" such as silicon nitride oxide contains more nitrogen than oxygen.

Figure 2A:
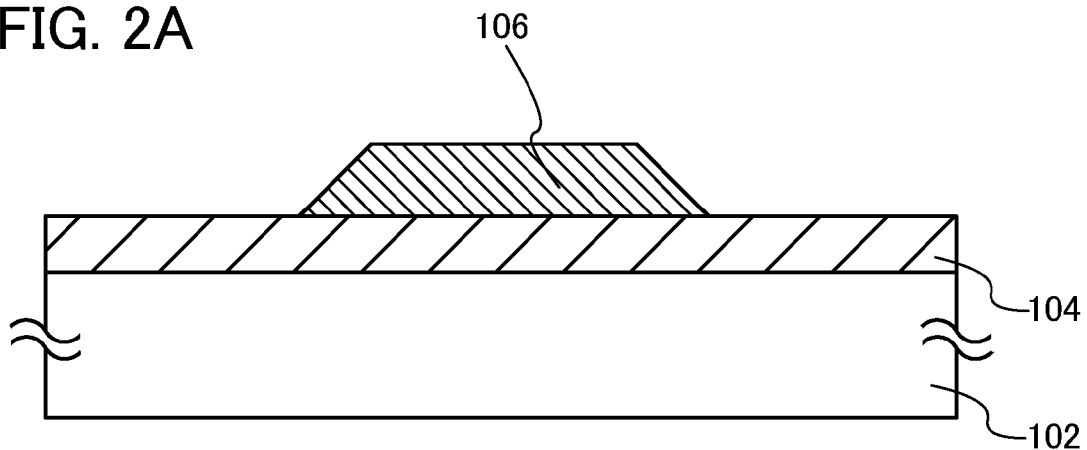
FIGS. 2A to 2C illustrate one embodiment of a method for manufacturing a semiconductor device.

Next, after a conductive film is formed over the base insulating film 104, the gate electrode 106 is formed through a photolithography step and an etching step (see FIG. 2A). The gate electrode 106 can be formed by a sputtering method or the like as a single layer or a stacked layer using a metal material such as molybdenum, titanium, tantalum, tungsten, aluminum, copper, neodymium, or scandium, or an alloy material containing any of these materials.

Figure 2B:
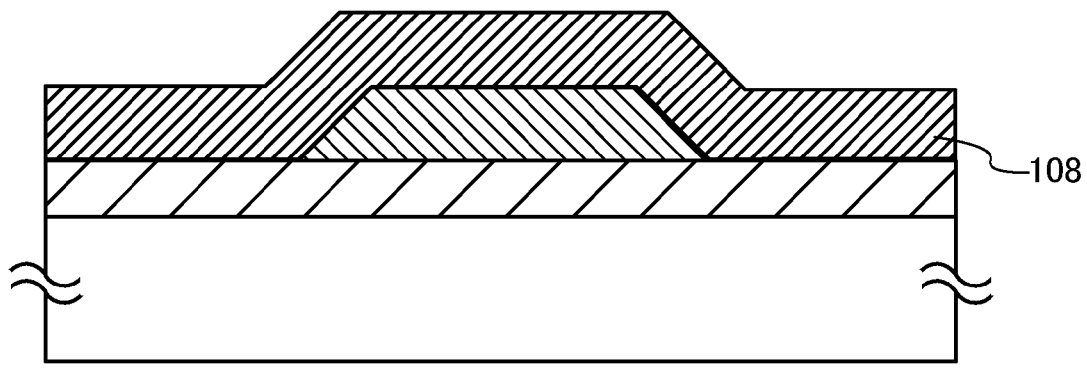

Next, the gate insulating film 108 is formed over the base insulating film 104 and the gate electrode 106 (see FIG. 2B). In this embodiment, a silicon oxynitride film can be used as the gate insulating film 108.

The silicon oxynitride film can be formed by a plasma CVD apparatus in vacuum, following the formation of the gate electrode.

The silicon oxynitride film can be formed using a gas such as $SiH_4$, $N_2O$, $NH_3$, or $N_2$.

The gate insulating film 108 preferably includes a region in which the oxygen content is higher than the stoichiometric proportion. In that case, the oxygen content is higher than the stoichiometric proportion of the gate insulating film 108. For example, in the case of using a silicon oxide film whose composition is expressed by $SiO_x$ (x>0), the stoichiometric proportion of silicon oxide is Si:O=1:2; therefore, a silicon oxide film including an oxygen-excess region, in which x is greater than 2, is preferably used. Such an oxygen-excess region exists in part (including an interface) of the silicon oxide film.

When the gate insulating film 108 in contact with the oxide semiconductor film 110 to be formed later includes a region in which the oxygen content is higher than the stoichiometric proportion, transfer of oxygen from the oxide semiconductor film 110 to the gate insulating film 108 in contact therewith can be suppressed and oxygen can be supplied from the gate insulating film 108 in contact with the oxide semiconductor film 110 to the oxide semiconductor film 110.

Next, heat treatment is performed on the substrate 102 over which the silicon oxynitride film is formed, in order to remove moisture, hydrogen, or the like.

For the heat treatment, an electric furnace or a device for heating an object by heat conduction or heat radiation from or a heating element such as a resistance heating element can be used. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA treatment may be performed as follows. The object to be processed is put in a heated inert gas atmosphere, heated for several minutes, and taken out of the inert gas atmosphere. The GRTA treatment enables high-temperature heat treatment for a short time. Moreover, the GRTA treatment can be employed even when the temperature exceeds the upper temperature limit of the object to be processed. Note that the inert gas may be changed during the treatment to a gas including oxygen. The heat treatment is performed in an atmosphere including oxygen, whereby the defect density in the film can be decreased.

Note that as the inert gas atmosphere, an atmosphere that contains nitrogen or a rare gas (e.g., helium, neon, or argon) as its main component and does not include moisture, hydrogen, or the like is preferably used. For example, the purity of nitrogen or a rare gas such as helium, neon, or argon introduced into the heat treatment apparatus is higher than or equal to 6N (99.9999%), preferably higher than or equal to 7N (99.99999%) (that is, the impurity concentration is lower than or equal to 1 ppm, preferably lower than or equal to 0.1 ppm).

In the case where the mother glass is used as the substrate 102, high process temperature and a long period of process time drastically shrink the mother glass; therefore, the temperature of the heat treatment is higher than or equal to 200° C. and lower than or equal to 450° C., preferably higher than or equal to 250° C. and lower than or equal to 350° C.

Impurities such as water or hydrogen in the silicon oxynitride film can be removed by the heat treatment. In addition, the defect density in the film can be decreased by the heat treatment. Impurities in the silicon oxynitride film are removed or the defect density in the film is decreased, so that the reliability of the semiconductor device can be improved. For example, deterioration of the semiconductor device due to a negative bias stress test with light irradiation, which is one of reliability tests for semiconductor devices, can be suppressed.

The above heat treatment can be referred to as dehydration treatment, dehydrogenation treatment, or the like because of its advantageous effect of removing moisture, hydrogen, or the like. Such dehydration treatment or dehydrogenation treatment may be performed once or plural times.

Figure 2C:
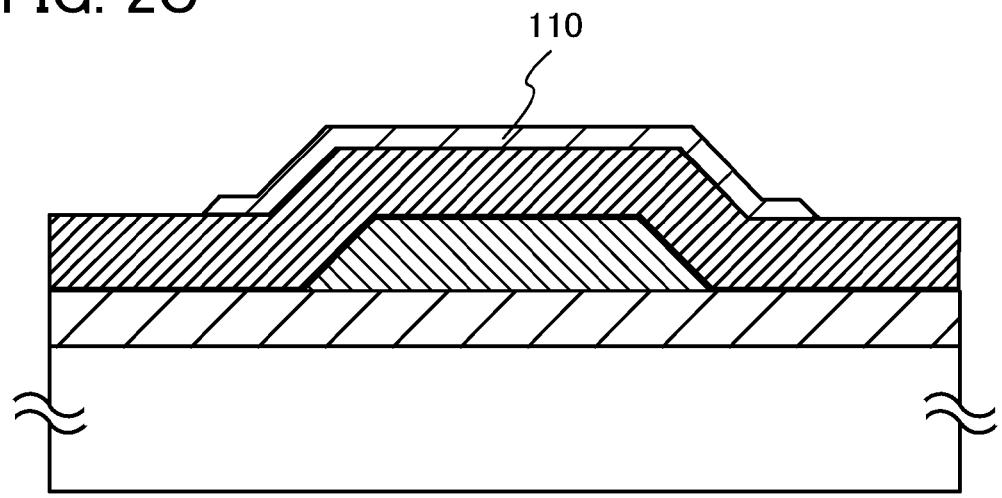

Next, the oxide semiconductor film 110 is formed (see FIG. 2C).

As an oxide semiconductor for forming the oxide semiconductor film 110, an intrinsic (i-type) or substantially intrinsic (i-type) oxide semiconductor obtained by removing impurities to highly purify the oxide semiconductor so that impurities which are carrier donors besides main components do not exist in the oxide semiconductor as much as possible, is used.

The oxide semiconductor film 110 may be either single crystal or non-single-crystal. In the latter case, the oxide semiconductor film may be either amorphous or polycrystal. Further, the oxide semiconductor film may have either an amorphous structure including a portion having crystallinity or a non-amorphous structure.

It is relatively easy to make a surface of an amorphous oxide semiconductor film flat. Thus, when a transistor is manufactured with the use of the oxide semiconductor film, interface scattering can be reduced, and relatively high mobility can be obtained relatively easily.

In an oxide semiconductor film having crystallinity (a crystalline oxide semiconductor film), defects in the bulk can be further reduced, and mobility higher than that of an amorphous oxide semiconductor film can be obtained when a surface flatness is improved. In order to improve the surface flatness, the oxide semiconductor film is preferably formed on a flat surface. Specifically, the oxide semiconductor film is preferably formed on a surface with an average surface roughness ($R_a$) of less than or equal to 1 nm, preferably less than or equal to 0.3 nm, more preferably less than or equal to 0.1 nm. Note that the average surface roughness ($R_a$) is preferably close to 0.

The crystals in the crystalline oxide semiconductor film may have crystal axes oriented in random directions or in a certain direction.

As the oxide semiconductor film, a c-axis aligned crystalline oxide semiconductor (CAAC-OS) film can be used.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and layers including metal atoms and oxygen atoms are arranged to have a layered structure (Note that normal vectors of the layers are the c-axis direction.). Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film in a transistor, change in electric characteristics of the transistor due to irradiation with visible light or ultraviolet light is small. Thus, the transistor has high reliability.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

As an example of the sputtering target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

The oxide semiconductor film 110 can have a thickness greater than or equal to 1 nm and less than or equal to 200 nm, preferably greater than or equal to 15 nm and less than or equal to 30 nm and can be formed by a sputtering method, a molecular beam epitaxy (MBE) method, a pulsed laser deposition method, an atomic layer deposition (ALD) method, or the like as appropriate. The oxide semiconductor film 110 may be formed using a sputtering apparatus which performs deposition with surfaces of a plurality of substrates set substantially perpendicular to a surface of a sputtering target.

It is preferable that impurities such as hydrogen, water, a hydroxyl group, or hydride in a deposition chamber be removed by heating and evacuation of the deposition chamber before deposition of the oxide semiconductor. It is particularly important to remove such impurities adsorbed on an inner wall of the deposition chamber. Here, the heat treatment may be performed at a temperature higher than or equal to 100° C. and lower than or equal to 450° C., for example. Evacuation of the deposition chamber is preferably performed with a rough vacuum pump such as a dry pump, and a high vacuum pump such as a sputter ion pump, a turbo molecular pump, or a cryopump, in appropriate combination. The turbo molecular pump has an outstanding capability in evacuating a large-sized molecule, whereas it has a low capability in evacuating hydrogen or moisture. Further, combination with a cryopump having a high capability in evacuating moisture or a sputter ion pump having a high capability in evacuating hydrogen is effective. At this time, when the impurities are removed while an inert gas is introduced, the rate of desorption of moisture or the like, which is difficult to desorb only by evacuation, can be further increased. Removal of impurities in the deposition chamber by such treatment before the deposition of the oxide semiconductor can prevent hydrogen, water, a hydroxyl group, hydride, or the like from entering the oxide semiconductor film 110.

An oxide semiconductor to be used preferably contains at least indium (In) or zinc (Zn). In particular, In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Titanium (Ti) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, a single-component metal oxide such as indium oxide, tin oxide, or zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as its main component, and there is no limitation on the ratio of In:Ga:Zn. Further, the In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn=1:1:1 or In:Ga:Zn=2:2:1, or any of oxides whose composition is in the neighborhood of the above can be used. Alternatively, an In—Sn—Zn-based oxide with an atomic ratio of In:Sn:Zn=1:1:1, In:Sn:Zn=2:1:3, or In:Sn:Zn=2:1:5, or any of oxides whose composition is in the neighborhood of the above may be used.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

For example, it is relatively easy to obtain high mobility with an In—Sn—Zn-based oxide. However, mobility can be increased by reducing the defect density in a bulk also in the case of using an In—Ga—Zn-based oxide.

Note that for example, the expression "the composition of an oxide containing In, Ga, and Zn at an atomic ratio, In:Ga:Zn=a:b:c (a+b+c=1), is in the neighborhood of the composition of an oxide containing In, Ga, and Zn at an atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

In the case where an In—Ga—Zn-based oxide is used for the oxide semiconductor, a target having a composition of $In_2O_3:Ga_2O_3:ZnO=1:x:y$ [molar ratio] (x is greater than or equal to 0, y is greater than or equal to 0.5 and less than or equal to 5) is preferably used. For example, a target having a composition of $In_2O_3:Ga_2O_3:ZnO=1:1:2$ [molar ratio], or the like can be used. It is also possible to use a target with a composition of $In_2O_3:Ga_2O_3:ZnO=1:1:1$ [molar ratio] or a target with a composition of $In_2O_3:Ga_2O_3:ZnO=1:1:4$ [molar ratio].

In the case where an In—Sn—Zn-based oxide is used for the oxide semiconductor, an atomic ratio of metal elements in a target to be used may be In:Sn:Zn=1:2:2, In:Sn:Zn=2:1:3, In:Sn:Zn=1:1:1, In:Sn:Zn=20:45:35, or the like.

In the case where an In—Zn-based oxide is used for the oxide semiconductor, an atomic ratio of metal elements in a target to be used is In:Zn=50:1 to 1:2 ($In_2O_3:ZnO$=25:1 to 1:4 in a molar ratio), preferably In:Zn=20:1 to 1:1 ($In_2O_3:ZnO$=10:1 to 1:2 in a molar ratio), further preferably In:Zn=15:1 to 1.5:1 ($In_2O_3:ZnO$=15:2 to 3:4 in a molar ratio). For example, in a target used for formation of an In—Zn-based oxide which has an atomic ratio of In:Zn:O=X:Y:Z, the relation of Z>1.5X+Y is satisfied.

Note that it is preferable that the oxide semiconductor film 110 be formed under a condition that much oxygen is contained during deposition (e.g., deposited by a sputtering method in an atmosphere where the proportion of oxygen is 100%), so that a film containing much oxygen (preferably including a region where the oxygen content is higher than the stoichiometric composition of the oxide semiconductor in a crystalline state) is formed.

The deposition atmosphere may be a rare gas (typically argon) atmosphere, an oxygen atmosphere, or a mixed atmosphere containing a rare gas and oxygen. Here, when the volume of oxygen is larger than the volume of a rare gas at the time of the deposition, supply of oxygen into the oxide semiconductor film 110 can be facilitated and oxygen vacancies in the oxide semiconductor film 110 can be reduced. In order to prevent hydrogen, water, a hydroxyl group, hydride, or the like from entering the oxide semiconductor film 110, an atmosphere of a high-purity gas from which impurities such as hydrogen, water, a hydroxyl group, or hydride are sufficiently removed is preferable.

After the deposition of the oxide semiconductor film 110, heat treatment may be performed on the oxide semiconductor film 110 in order to remove excess hydrogen (including moisture and a hydroxyl group) (to perform dehydration or dehydrogenation). The heat treatment can further remove hydrogen atoms or substances including hydrogen atoms in the oxide semiconductor film 110. The heat treatment is performed in an inert gas atmosphere at higher than or equal to 250° C. and lower than or equal to 700° C., preferably higher than or equal to 450° C. and lower than or equal to 600° C., and lower than the strain point of the substrate. The inert gas atmosphere is preferably an atmosphere which contains nitrogen or a rare gas (e.g., helium, neon, or argon) as its main component and does not contain moisture, hydrogen, or the like. For example, the purity of nitrogen or a rare gas such as helium, neon, or argon introduced into a heat treatment apparatus is higher than or equal to 6N (99.9999%), preferably higher than or equal to 7N (99.99999%) (that is, the concentration of the impurities is lower than or equal to 1 ppm, preferably lower than or equal to 0.1 ppm).

For example, after the substrate is introduced into an electric furnace including a resistance heating element or the like, the heat treatment can be performed at 450° C. in a nitrogen atmosphere for one hour.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas like argon, is used. Note that in the case where a GRTA apparatus is used as the heat treatment apparatus, the substrate may be heated in an inert gas heated to a high temperature of 650° C. to 700° C. because the heat treatment time is short.

The above heat treatment has an advantageous effect of removing moisture, hydrogen, or the like and can be referred to as dehydration treatment, dehydrogenation treatment, or the like. The heat treatment can be performed at the timing, for example, after the oxide semiconductor film is processed into an island shape. Such dehydration treatment or dehydrogenation treatment may be performed once or plural times.

After the above heat treatment is performed on the oxide semiconductor film 110, heat treatment for supply of oxygen (supplying oxygen to an oxide semiconductor film; the same can be applied to the description hereinafter) may be performed in the same furnace. The heat treatment may be performed at a temperature higher than or equal to 200° C. and lower than the strain point of the substrate in a heat treatment apparatus to which a high-purity oxygen gas, a high-purity $N_2O$ gas, or ultra dry air (with a moisture content of 20 ppm (−55° C. by conversion into a dew point) or less, preferably 1 ppm or less, further preferably 10 ppb or less, in the case where measurement is performed with the use of a dew point meter of a cavity ring down laser spectroscopy (CRDS) system) is introduced. The heat treatment is performed preferably at a temperature higher than or equal to 250° C. and lower than or equal to 450° C. It is particularly preferable that moisture, hydrogen, or the like be not contained in these gases. The purity of the oxygen gas or the $N_2O$ gas that is introduced into the same furnace is preferably greater than or equal to 6N, further preferably greater than or equal to 7N (i.e., the impurity concentration is preferably less than or equal to 1 ppm, further preferably less than or equal to 0.1 ppm). By the action of the oxygen gas or the $N_2O$ gas, oxygen that is a main component of the oxide semiconductor and that has been reduced through the steps for removing impurities by dehydration or dehydrogenation treatment can be supplied. Through this step, an oxygen vacancy generated by dehydration or dehydrogenation treatment can be compensated.

Note that the above heat treatment has an advantageous effect for compensating an oxygen vacancy generated in the oxide semiconductor by dehydration treatment or dehydrogenation treatment; thus, the heat treatment can also be referred to as oxygen supplying treatment or the like. The heat treatment can be performed at the timing, for example, after the oxide semiconductor film is processed into an island shape. Such oxygen supplying treatment may be performed once or plural times.

Figure 3A:
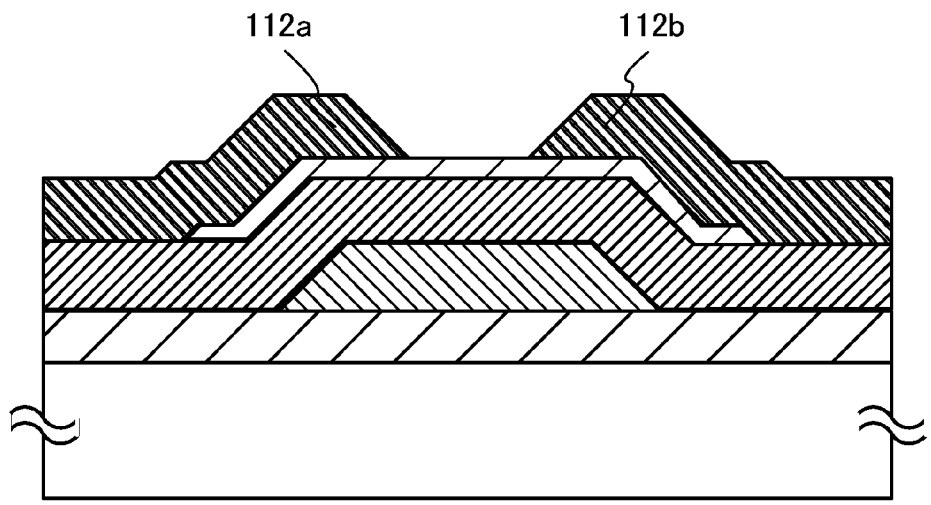
FIGS. 3A and 3B illustrate one embodiment of a method for manufacturing a semiconductor device.

Next, a conductive film is formed over the gate insulating film 108 and the oxide semiconductor film 110 and is subjected to a photolithography step and an etching step, whereby the source electrode 112a and the drain electrode 112b are formed (see FIG. 3A).

As the conductive film used for the source electrode 112a and the drain electrode 112b, for example, a metal film containing an element selected from Al, Cr, Cu, Ta, Ti, Mo, and W or a metal nitride film containing any of the above elements as a component (a titanium nitride film, a molybdenum nitride film, or a tungsten nitride film) can be used. A high-melting-point metal film of Ti, Mo, W, or the like or a metal nitride film of any of these elements (a titanium nitride film, a molybdenum nitride film, or a tungsten nitride film) may be stacked on one of or both a bottom side and a top side of a metal film of Al, Cu, or the like.

Figure 3B:
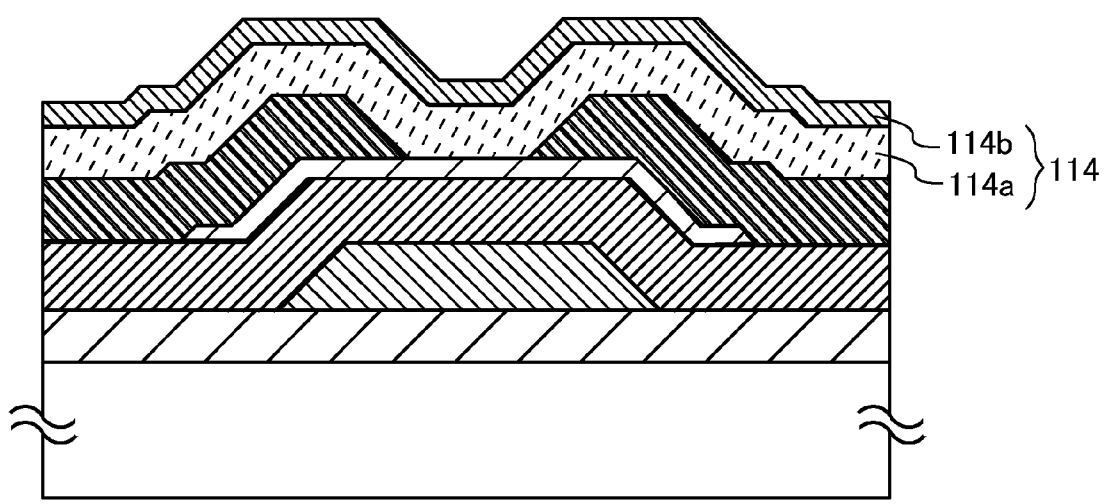

Next, the protective film 114 is formed over the oxide semiconductor film 110, the source electrode 112a, and the drain electrode 112b (see FIG. 3B). In this embodiment, a stack of the oxide insulating film 114a and the metal oxide film 114b can be used as the protective film 114.

The oxide insulating film 114a preferably includes a region in which the oxygen content is higher than the stoichiometric proportion. When the oxide insulating film 114a includes a region in which the oxygen content is higher than the stoichiometric proportion, transfer of oxygen from the oxide semiconductor film 110 to the oxide insulating film 114a in contact therewith can be suppressed and oxygen can be supplied from the oxide insulating film 114a in contact with the oxide semiconductor film 110 to the oxide semiconductor film 110. Further, for example, in the case where a silicon oxide film is used as the oxide insulating film 114a, a sputtering method or a plasma CVD method can be employed.

The metal oxide film 114b is preferably formed using a material which contains an element of Group 12 or Group 13, or an element of Group 3 having a property similar to that of the element of Group 13, which is the same group as one of the elements included in the oxide semiconductor film 110. For example, in the case where the oxide semiconductor film 110 includes oxides of indium (In) and zinc (Zn), it is preferable to use the insulating metal oxide film 114b formed using an element belonging to the same group as zinc, namely, Group 12, an element belonging to the same group as indium, namely, Group 13, or an element of Group 3 having a property similar to that of the element of Group 13. As the element of Group 3, an oxide film including a lanthanoid-based element such as cerium (Ce) or gadolinium (Gd) may be used. As the metal oxide film 114b, an aluminum oxide film, a gallium oxide film, or a zinc oxide film can be selected as a favorable example.

The metal oxide film 114b can be formed by a sputtering method using a metal oxide target or a metal target. As an atmosphere in sputtering, an inert gas atmosphere, an oxygen gas atmosphere, a mixed atmosphere containing an inert gas and an oxygen gas, or the like can be used. Examples of a sputtering method include an RF sputtering method in which a high-frequency power source is used as a sputtering power source, a DC sputtering method in which a direct-current power source is used, and an AC sputtering method in which an alternating-current power source is used. Alternatively, a pulsed DC sputtering method in which a bias is applied in a pulsed manner can be used. The metal oxide film 114b is preferably formed by an RF sputtering method or an AC sputtering method because the metal oxide film 114b can be dense. The metal oxide film 114b is preferably formed while the substrate is heated because the metal oxide film 114b can be dense.

It is preferable that heat treatment be performed in a pre-heating chamber of a sputtering apparatus as pre-treatment for the metal oxide film 114b and impurities such as water or hydrogen be removed and evacuated so that the metal oxide film 114b includes impurities such as water or hydrogen as little as possible in formation of the metal oxide film 114b. As an evacuation unit provided in the pre-heating chamber, a cryopump is preferable.

Further, as the metal oxide film 114b, it is particularly preferable to use an aluminum oxide film with a film density of higher than or equal to $3.2 \text{ g/cm}^3$, preferably higher than or equal to $3.6 \text{ g/cm}^3$. The aluminum oxide film has a thickness greater than or equal to 30 nm and less than or equal to 150 nm, preferably greater than or equal to 50 nm and less than or equal to 100 nm. When an aluminum oxide film is used as the metal oxide film 114b and has a film density within the above range, entry and diffusion of water or hydrogen into the oxide semiconductor film can be suppressed. In addition, release of oxygen from the oxide semiconductor film can be suppressed.

Heat treatment may be performed after the metal oxide film 114b is formed. By the heat treatment, oxygen can be supplied to the oxide semiconductor film 110 and micro-defects in the film and defects at the interface between stacked layers can be repaired. Thus, the oxide semiconductor film 110 can be highly purified to become i-type (intrinsic). The temperature of the heat treatment is preferably higher than or equal to 300° C. and lower than or equal to 350° C.

Note that a planarization insulating film may be formed over the protective film 114 in order to reduce the unevenness of the transistor 150. For the planarization insulating film, an organic material such as a polyimide-based resin, an acrylic resin, or a benzocyclobutene-based resin can be used.

A single layer selected from zinc oxide (ZnO), indium tin oxide (ITO), titanium oxide ($TiO_x$), aluminum (Al), and titanium (Ti) or a stack of any of them may be provided in contact with the metal oxide film 114b.

The above metal oxide or metal is provided in contact with the metal oxide film 114b, whereby charges accumulated between the oxide insulating film 114a and the aluminum oxide film serving as the metal oxide film 114b can be released and charge accumulation on a surface of the protective film 114 can be suppressed.

As described above, in the semiconductor device including the oxide semiconductor, which is described in this embodiment, the film including the metal oxide film is provided as the protective film in contact with the oxide semiconductor film. The metal oxide film can suppress entry and diffusion of water or hydrogen into the oxide semiconductor film. In addition, release of oxygen from the oxide semiconductor film can be suppressed.

Therefore, a semiconductor device including an oxide semiconductor, which has more stable electric characteristics and high reliability, can be provided. Further, a method for manufacturing the semiconductor device can be provided.

This embodiment can be combined with any of the other embodiments as appropriate.

Embodiment 2

In this embodiment, a semiconductor device including a transistor according to one embodiment of the present invention and a method for manufacturing the semiconductor device will be described with reference to FIG. 4.

<Structure of Semiconductor Device of Embodiment 2>

Figure 4:
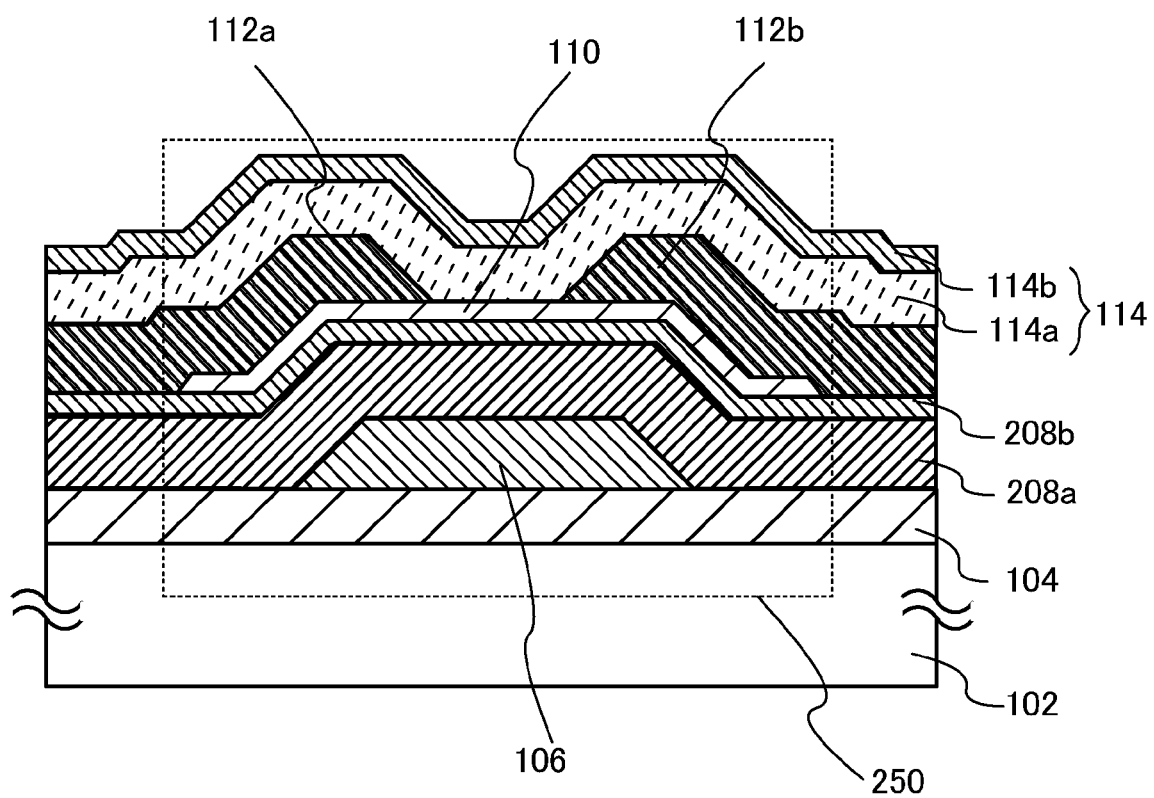
FIG. 4 illustrates a cross section of one embodiment of a semiconductor device.

FIG. 4 is a cross-sectional view of a semiconductor device including an oxide semiconductor film. A transistor 250 in FIG. 4 includes the gate electrode 106 formed over the substrate 102 having an insulating surface over which the base insulating film 104 is provided, a gate insulating film 208a formed over the base insulating film 104 and the gate electrode 106, a metal oxide film 208b formed over the gate insulating film 208a, the oxide semiconductor film 110 formed over the metal oxide film 208b, the source electrode 112a and the drain electrode 112b formed over the metal oxide film 208b and the oxide semiconductor film 110, and the protective film 114 formed over the oxide semiconductor film 110, the source electrode 112a, and the drain electrode 112b. The protective film 114 is a stack of the oxide insulating film 114a and the metal oxide film 114b.

This embodiment is different from Embodiment 1 in that the metal oxide film is provided over the gate insulating film.

<Manufacturing Method of Semiconductor Device of Embodiment 2>

Next, a method for manufacturing the transistor 250 will be described.

First, the base insulating film 104 is formed over the substrate 102, and the gate electrode 106 is formed over the base insulating film 104.

Embodiment 1 can be referred to for the formation methods, materials, and the like of the substrate 102, the base insulating film 104, and the gate electrode 106.

Next, the gate insulating film 208a is formed over the base insulating film 104 and the gate electrode 106.

Embodiment 1 can be referred to for the formation method, material, and the like of the gate insulating film 208a.

Next, the metal oxide film 208b and the oxide semiconductor film 110 are formed over the gate insulating film 208a.

The metal oxide film 208b and the oxide semiconductor film 110 can be successively formed in vacuum by a multi-chamber sputtering apparatus.

In the case where heat treatment is performed before the metal oxide film 208b is formed, heat treatment, formation of the metal oxide film 208b, and formation of the oxide semiconductor film 110 can be successively formed in vacuum by a multi-chamber sputtering apparatus.

The metal oxide film 208b is preferably formed using a material including an element of Group 12, Group 13, or Group 3, which is the same group as one of the elements included in the oxide semiconductor film 110 because the metal oxide film 208b is in contact with the oxide semiconductor film 110. For example, in the case where the oxide semiconductor film 110 includes oxides of indium and zinc, it is preferable to use the insulating metal oxide film 208b formed using an element belonging to the same group as zinc, namely, Group 12, an element belonging to the same group as indium, namely, Group 13, or an element of Group 3 having a property similar to that of the element of Group 13. As the element of Group 3, an oxide film including a lanthanoid-based element such as cerium (Ce) or gadolinium (Gd) may be used. As the metal oxide film 208b, an aluminum oxide film, a gallium oxide film, or a zinc oxide film can be selected as a favorable example.

The metal oxide film 208b can be formed by a sputtering method using a metal oxide target or a metal target. As an atmosphere in sputtering, an inert gas atmosphere, an oxygen gas atmosphere, a mixed atmosphere containing an inert gas and an oxygen gas, or the like can be used. Examples of a sputtering method include an RF sputtering method in which a high-frequency power source is used as a sputtering power source, a DC sputtering method in which a direct-current power source is used, and an AC sputtering method in which an alternating-current power source is used. Alternatively, a pulsed DC sputtering method in which a bias is applied in a pulsed manner can be used. The metal oxide film 208b is preferably formed by an RF sputtering method or an AC sputtering method because the metal oxide film 208b can be dense. The metal oxide film 208b is preferably formed while the substrate is heated because the metal oxide film 208b can be dense.

The following steps are preferably performed so that moisture or hydrogen is included in the metal oxide film 208b and the oxide semiconductor film 110 as little as possible in formation of the metal oxide film 208b and the oxide semiconductor film 110: heat treatment is performed on the substrate 102 over which the gate insulating film 208a is formed in a pre-heating chamber of a sputtering apparatus, i.e., in vacuum, as pre-treatment for the metal oxide film 208b; and impurities such as water or hydrogen adsorbed on the substrate 102 and the gate insulating film 208a are removed and evacuated. As an evacuation unit provided in the pre-heating chamber, a cryopump is preferable.

Embodiment 1 can be referred to for the material and the like of the oxide semiconductor film 110.

Next, a conductive film is formed over the metal oxide film 208b and the oxide semiconductor film 110 and is subjected to a photolithography step and an etching step, whereby the source electrode 112a and the drain electrode 112b are formed.

Next, the protective film 114 is formed over the oxide semiconductor film 110, the source electrode 112a, and the drain electrode 112b. Through the above steps, the transistor 250 is formed.

Embodiment 1 can be referred to for the materials and the like of the source electrode 112a, the drain electrode 112b, and the protective film 114.

Further, as the metal oxide film 114b of the protective film 114, it is preferable to use an aluminum oxide film with a film density of higher than or equal to 3.2 g/cm$^3$, preferably higher than or equal to 3.6 g/cm$^3$. The aluminum oxide film has a thickness greater than or equal to 30 nm and less than or equal to 150 nm, preferably greater than or equal to 50 nm and less than or equal to 100 nm. When an aluminum oxide film is used as the metal oxide film 114b and the film density of the aluminum oxide film is within the above range, entry and diffusion of water or hydrogen into the oxide semiconductor film can be suppressed. In addition, release of oxygen from the oxide semiconductor film can be suppressed.

Heat treatment may be performed after the metal oxide film 114b is formed. By the heat treatment, oxygen can be supplied to the oxide semiconductor film 110 and micro-defects in the film and defects at the interface between stacked layers can be repaired. Thus, the oxide semiconductor film 110 can be highly purified to become i-type (intrinsic). The temperature of the heat treatment is preferably higher than or equal to 300° C. and lower than or equal to 350° C.

Note that a planarization insulating film may be formed over the protective film 114 in order to reduce the unevenness of the transistor 250. For the planarization insulating film, an organic material such as a polyimide-based resin, an acrylic resin, or a benzocyclobutene-based resin can be used.

A single layer selected from zinc oxide (ZnO), indium tin oxide (ITO), titanium oxide ($TiO_x$), aluminum (Al), and titanium (Ti) or a stack of any of them may be provided in contact with the metal oxide film 114b.

The above metal oxide or metal is provided in contact with the aluminum oxide film, whereby charges accumulated between the oxide insulating film 114a and the aluminum oxide film serving as the metal oxide film 114b can be released and charge accumulation on a surface of the protective film 114 can be suppressed.

As described above, in the semiconductor device including the oxide semiconductor, which is described in this embodiment, the film including the metal oxide film is provided as the protective film in contact with the oxide semiconductor film. With a structure in which the metal oxide film is in contact with the oxide semiconductor film, The interface characteristics are extremely stable because the metal oxide film is formed using a material including an element of the same group as that of an element other than oxygen included in the oxide semiconductor film. Further, the metal oxide film can suppress entry and diffusion of water or hydrogen into the oxide semiconductor film. In addition, release of oxygen from the oxide semiconductor film can be suppressed.

Since the metal oxide film and the oxide semiconductor film are successively formed in vacuum without exposure to the air, the interface between the metal oxide film and the oxide semiconductor film can be kept clean.

Therefore, a semiconductor device including an oxide semiconductor, which has more stable electric characteristics and high reliability, can be provided. Further, a method for manufacturing the semiconductor device can be provided.

This embodiment can be combined with any of the other embodiments as appropriate.

Embodiment 3

A semiconductor device having a display function (also referred to as a display device) can be manufactured using the transistor described in Embodiment 1. Moreover, part or all of a driver circuit which includes the transistor can be formed over a substrate where a pixel portion is formed, whereby a system-on-panel can be obtained.

Figure 5A:
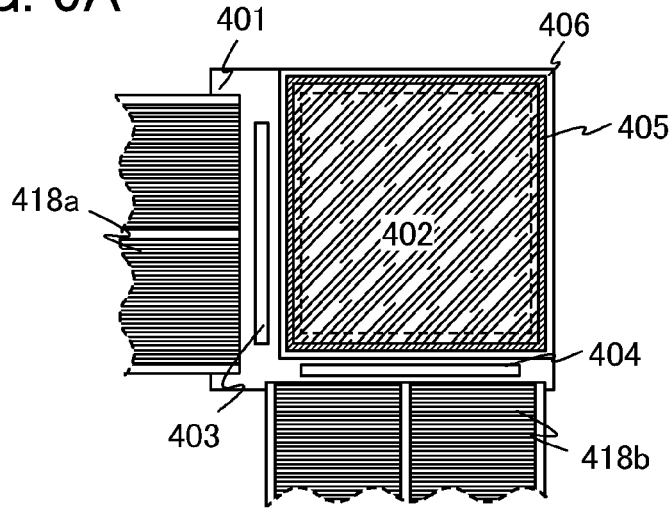
FIGS. 5A to 5C each illustrate a plane of one embodiment of a semiconductor device.

In FIG. 5A, a sealant 405 is provided so as to surround a pixel portion 402 provided over a first substrate 401, and the pixel portion 402 is sealed by using a second substrate 406. In FIG. 5A, a signal line driver circuit 403 and a scan line driver circuit 404 which are formed using a single crystal semiconductor film or a polycrystalline semiconductor film over a substrate separately prepared are mounted in a region that is different from the region surrounded by the sealant 405 over the first substrate 401. Various signals and potentials are supplied to the signal line driver circuit 403 and the scan line driver circuit 404 which are separately formed and the pixel portion 402 from flexible printed circuits (FPCs) 418a and 418b.

Figure 5B:
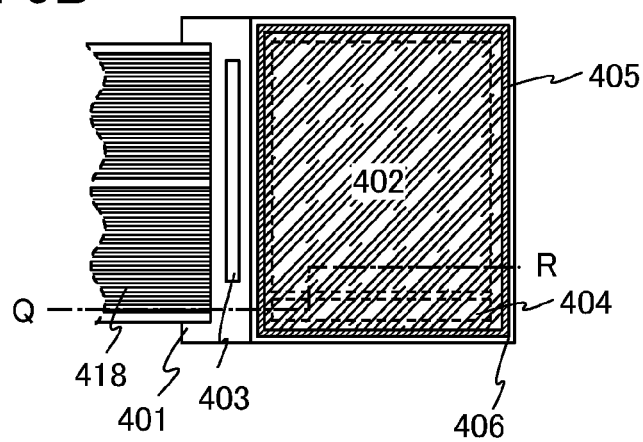
Figure 5C:
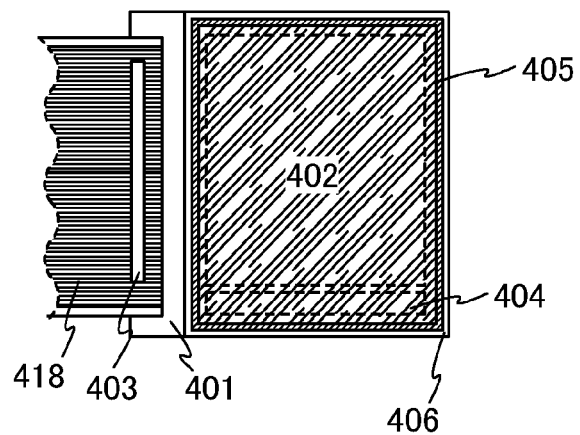

In FIGS. 5B and 5C, the sealant 405 is provided so as to surround the pixel portion 402 and the scan line driver circuit 404 which are provided over the first substrate 401. The second substrate 406 is provided over the pixel portion 402 and the scan line driver circuit 404. Consequently, the pixel portion 402 and the scan line driver circuit 404 are sealed together with a display element, by the first substrate 401, the sealant 405, and the second substrate 406. In FIGS. 5B and 5C, the signal line driver circuit 403 which is formed using a single crystal semiconductor film or a polycrystalline semiconductor film over a substrate prepared separately is mounted in a region that is different from the region surrounded by the sealant 405 over the first substrate 401. In FIGS. 5B and 5C, various signals and potentials are supplied to the signal line driver circuit 403 which is separately formed, the scan line driver circuit 404, and the pixel portion 402 from an FPC 418.

Although FIGS. 5B and 5C each illustrate an example in which the signal line driver circuit 403 is formed separately and mounted on the first substrate 401, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 5A illustrates an example in which the signal line driver circuit 403 and the scan line driver circuit 404 are mounted by a COG method. FIG. 5B illustrates an example in which the signal line driver circuit 403 is mounted by a COG method. FIG. 5C illustrates an example in which the signal line driver circuit 403 is mounted by a TAB method.

In addition, the display device includes a panel in which the display element is sealed, and a module in which an IC or the like including a controller is mounted on the panel.

Note that the display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion 402 and the scan line driver circuit 404 provided over the first substrate 401 include a plurality of transistors, and the transistor described in Embodiment 1 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 6:
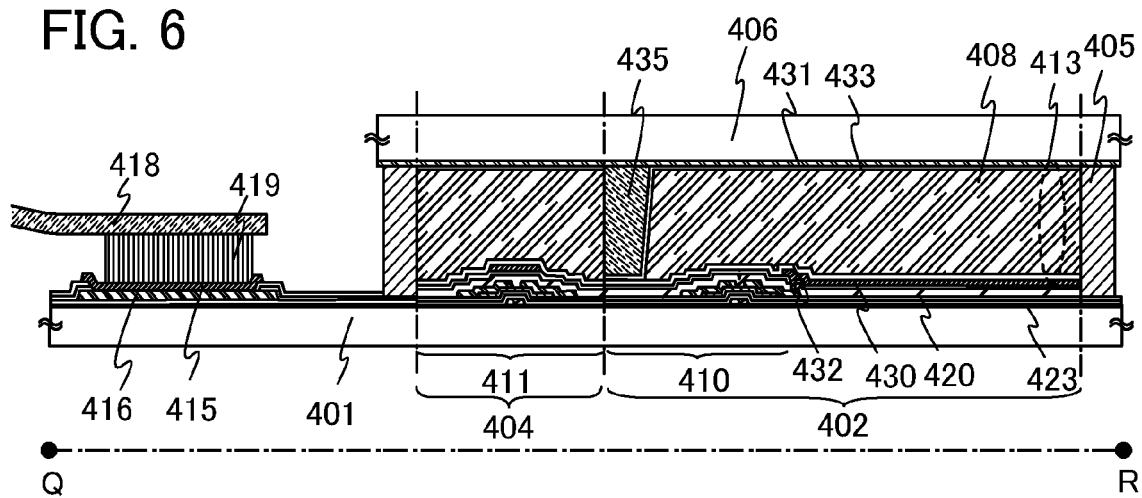
FIG. 6 illustrates a cross section of one embodiment of a semiconductor device.
Figure 7:
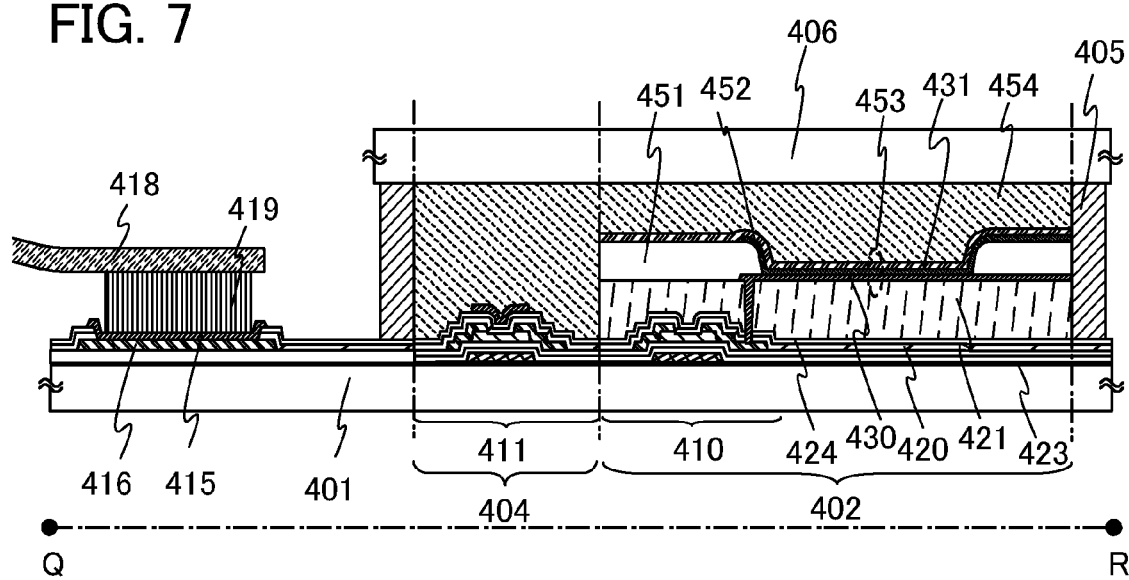
FIG. 7 illustrates a cross section of one embodiment of a semiconductor device.

One embodiment of the semiconductor device is described with reference to FIG. 6 and FIG. 7. FIG. 6 and FIG. 7 correspond to cross-sectional views taken along line Q-R in FIG. 5B.

As illustrated in FIG. 6 and FIG. 7, the semiconductor device includes a connection terminal electrode layer 415 and a terminal electrode layer 416. The connection terminal electrode layer 415 and the terminal electrode layer 416 are electrically connected to a terminal included in the FPC 418 through an anisotropic conductive film 419.

The connection terminal electrode layer 415 is formed using the same conductive film as a first electrode layer 430, and the terminal electrode layer 416 is formed using the same conductive film as source and drain electrode layers of transistors 410 and 411.

The pixel portion 402 and the scan line driver circuit 404 which are provided over the first substrate 401 include a plurality of transistors. In FIG. 6 and FIG. 7, the transistor 410 included in the pixel portion 402 and the transistor 411 included in the scan line driver circuit 404 are illustrated as an example. In FIG. 6, a protective film 420 is provided over the transistors 410 and 411, and in FIG. 7, a protective film 424 and an insulating film 421 are further provided. Note that an insulating film 423 is an insulating film serving as a base film.

In this embodiment, the transistor described in Embodiment 1 can be applied to the transistor 410 and the transistor 411.

The transistor 410 and the transistor 411 are each a transistor including an oxide semiconductor film in which formation of an oxygen vacancy and entry of water or hydrogen are suppressed. Therefore, variation in the electric characteristics of the transistors 410 and 411 is suppressed, and the transistors 410 and 411 are electrically stable.

As described above, highly reliable semiconductor devices can be provided as the semiconductor devices of this embodiment illustrated in FIG. 6 and FIG. 7.

The transistor 410 provided in the pixel portion 402 is electrically connected to a display element to form a display panel. A variety of display elements can be used as the display element as long as display can be performed.

An example of a liquid crystal display device using a liquid crystal element as a display element is described in FIG. 6. In FIG. 6, a liquid crystal element 413 which is a display element includes the first electrode layer 430, a second electrode layer 431, and a liquid crystal layer 408. An insulating film 432 and an insulating film 433 which function as alignment films are provided so that the liquid crystal layer 408 is provided therebetween. The second electrode layer 431 is provided on the second substrate 406 side, and the first electrode layer 430 and the second electrode layer 431 are stacked with the liquid crystal layer 408 provided therebetween.

A columnar spacer 435 is obtained by selective etching of an insulating film and is provided in order to control the thickness (a cell gap) of the liquid crystal layer 408. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral agent is mixed is used for the liquid crystal layer in order to improve the temperature range. The liquid crystal composition which includes a liquid crystal exhibiting a blue phase and a chiral agent has a short response time, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor that includes an oxide semiconductor film has a possibility that the electric characteristics may vary significantly by the influence of static electricity and deviate from the designed range. Therefore, it is more effective to use a liquid crystal material exhibiting a blue phase for a liquid crystal display device including a transistor which includes an oxide semiconductor film.

The specific resistivity of the liquid crystal material is greater than or equal to $1 \times 10^9$ Ω·cm, preferably greater than or equal to $1 \times 10^{11}$ Ω·cm, more preferably greater than or equal to $1 \times 10^{12}$ Ω·cm. The value of the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current or the like of the transistor. By using the transistor including the oxide semiconductor film which includes an oxygen-excess region, it is enough to provide a storage capacitor having a capacitance that is 1/3 or less, preferably 1/5 or less of a liquid crystal capacitance of each pixel.

In the transistor used in this embodiment, which includes an oxide semiconductor film in which formation of an oxygen vacancy is suppressed, the current in an off state (the off-state current) can be made small. Accordingly, an electrical signal such as an image signal can be held for a long period, and a writing interval can be set long in an on state. Accordingly, the frequency of refresh operation can be reduced, which leads to an effect of suppressing power consumption.

The transistor used in this embodiment, which includes an oxide semiconductor film in which formation of an oxygen vacancy is suppressed, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA mode is a mode for controlling alignment of liquid crystal molecules of a liquid crystal display panel. In the VA mode, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors of R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of the color elements. The disclosed invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified depending on whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified depending on the element structure into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, at least one of a pair of electrodes has a light-transmitting property. The transistor and the light-emitting element are provided over the substrate. The light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side.

An example of a light-emitting device in which a light-emitting element is used as a display element is illustrated in FIG. 7. A light-emitting element 453 which is a display element is electrically connected to the transistor 410 provided in the pixel portion 402. A structure of the light-emitting element 453 is not limited to the stacked-layer structure including the first electrode layer 430, an electroluminescent layer 452, and the second electrode layer 431, which is illustrated in FIG. 7. The structure of the light-emitting element 453 can be changed as appropriate depending on a direction in which light is extracted from the light-emitting element 453, or the like.

A partition wall 451 is formed using an organic insulating material or an inorganic insulating material. It is particularly preferable that the partition wall 451 be formed using a photosensitive resin material to have an opening over the first electrode layer 430 so that a sidewall of the opening has a tilted surface with continuous curvature.

The electroluminescent layer 452 may be formed using a single layer or a plurality of layers stacked.

A protective film may be formed over the second electrode layer 431 and the partition wall 451 in order to prevent entry of oxygen, hydrogen, water, carbon dioxide, or the like into the light-emitting element 453. As the protective film, a silicon nitride film, a silicon nitride oxide film, a diamond like carbon (DLC) film, or the like can be formed. In addition, in a space which is formed with the first substrate 401, the second substrate 406, and the sealant 405, a filler 454 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 454, an ultraviolet curable resin or a thermosetting resin can be used as well as an inert gas such as nitrogen or argon. For example, polyvinyl chloride (PVC), an acrylic resin, a polyimide-based resin, an epoxy resin, a silicone resin, polyvinyl butyral (PVB), or ethylene vinyl acetate (EVA) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate for a light-emitting surface of the light-emitting element. Further, the polarizing plate or the circularly polarizing plate may be provided with an anti-reflection film. For example, anti-glare treatment by which reflected light can be diffused by surface roughness so as to reduce the glare can be performed.

Note that in FIG. 6 and FIG. 7, a flexible substrate as well as a glass substrate can be used as the first substrate 401 and the second substrate 406. For example, a plastic substrate having a light-transmitting property can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

In this embodiment, a silicon oxide film is used as the protective film 420, and an aluminum oxide film is used as the protective film 424 in FIG. 7. The protective film 420 and the protective film 424 can be formed by a sputtering method or a plasma CVD method.

The aluminum oxide film provided over the oxide semiconductor film as the protective film 424 preferably has a film density of higher than or equal to 3.2 g/cm$^3$, more preferably higher than or equal to 3.6 g/cm$^3$. Thus, a high blocking effect, which is not permeable to either oxygen or impurities such as hydrogen or water, can be obtained.

Therefore, during the manufacturing process and after the manufacture, the aluminum oxide film functions as a protective film for preventing entry of impurities such as hydrogen or water, which causes a change, into the oxide semiconductor film and release of oxygen, which is a main component material of the oxide semiconductor film, from the oxide semiconductor film.

The silicon oxide film provided as the protective film 420 in contact with the oxide semiconductor film has a function of supplying oxygen to the oxide semiconductor film. Therefore, the protective film 420 is preferably an oxide insulating film containing much oxygen.

The transistor 410 and the transistor 411 each include an oxide semiconductor film which is highly purified and in which formation of an oxygen vacancy is suppressed. In the transistor 410 and the transistor 411, a gate insulating film is formed using a silicon nitride oxide film, a silicon oxynitride film, and a metal oxide film. With such a structure of the gate insulating film, variation in characteristics is suppressed and the transistors are electrically stable.

The insulating film 421 serving as a planarization insulating film can be formed using an organic material having heat resistance, such as an acrylic resin, a polyimide-based resin, a benzocyclobutene-based resin, a polyamide resin, or an epoxy resin. The insulating film may be formed by stacking a plurality of insulating films formed of these materials.

There is no particular limitation on the method for forming the insulating film 421, and the insulating film 421 can be formed, depending on the material, by a method such as a sputtering method, an SOG method, spin coating, dipping, spray coating, a droplet discharge method (e.g., an inkjet method), or a printing method (e.g., screen printing or offset printing), or with a tool (equipment) such as a doctor knife, a roll coater, a curtain coater, or a knife coater.

The display device displays an image by transmitting light from a light source or a display element. Therefore, the substrate and the thin films such as the insulating film and the conductive film provided for the pixel portion where light is transmitted all have a light-transmitting property with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 430 and the second electrode layer 431 can be formed using a light-transmitting conductive material such as indium oxide containing tungsten oxide, indium zinc oxide containing tungsten oxide, indium oxide containing titanium oxide, indium tin oxide containing titanium oxide, ITO, indium zinc oxide, indium tin oxide to which silicon oxide is added, or graphene.

The first electrode layer 430 and the second electrode layer 431 can be formed using one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

A conductive composition containing a conductive high molecule (also referred to as a conductive polymer) can be used for the first electrode layer 430 and the second electrode layer 431. As the conductive high molecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken owing to static electricity or the like, a protective circuit for protecting the driver circuit is preferably provided. The protective circuit is preferably formed using a non-linear element.

As described above, by using any of the transistors described in the above embodiments, a semiconductor device having a variety of functions can be provided.

As described above, the aluminum oxide film having a film density of higher than or equal to 3.2 g/cm$^3$, more preferably higher than or equal to 3.6 g/cm$^3$, whereby entry and diffusion of water or hydrogen into the oxide semiconductor film can be suppressed in the semiconductor device including the transistors and having a display function. Therefore, variation in the electric characteristics of the transistors is suppressed and the transistors are electrically stable. Thus, by using the transistors, a highly reliable semiconductor device can be provided.

This embodiment can be combined with any of the other embodiments as appropriate.

Embodiment 4

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like. Examples of electronic appliances each including the semiconductor device described in any of the above embodiments will be described.

Figure 8A:
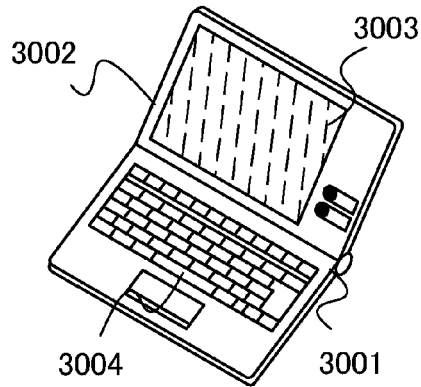
FIGS. 8A to 8F each illustrate an electronic appliance.

FIG. 8A illustrates a laptop personal computer, which includes a main body 3001, a housing 3002, a display portion 3003, a keyboard 3004, and the like. By applying the semiconductor device described in any of the above embodiments to the display portion 3003, a highly reliable laptop personal computer can be provided.

Figure 8B:
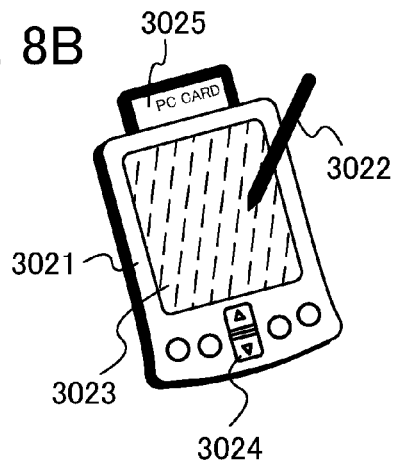

FIG. 8B is a personal digital assistant (PDA), which includes a main body 3021 provided with a display portion 3023, an external interface 3025, operation buttons 3024, and the like. A stylus 3022 is included as an accessory for operation. By applying the semiconductor device described in any of the above embodiments to the display portion 3023, a highly reliable personal digital assistant (PDA) can be provided.

Figure 8C:
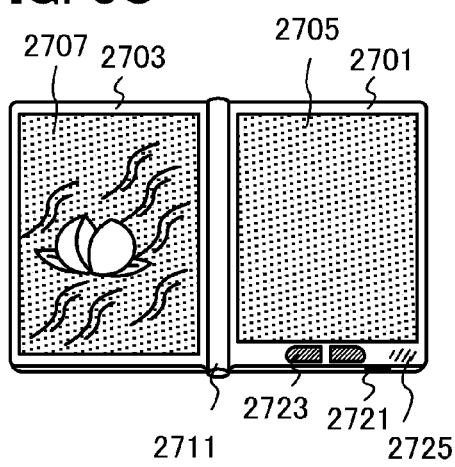

FIG. 8C illustrates an example of an electronic book reader. For example, the electronic book reader includes two housings, i.e., a housing 2701 and a housing 2703. The housing 2701 and the housing 2703 are combined with a hinge 2711 so that the electronic book reader can be opened and closed with the hinge 2711 as an axis. With such a structure, the electronic book reader can operate like a paper book. In addition, the electronic book reader can be more highly resistant to external impact. The housing 2701 and the housing 2703 can be separated from each other by detaching the hinge 2711.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 8C) can display text and the left display portion (the display portion 2707 in FIG. 8C) can display images. The semiconductor device described in any of the above embodiments is applied to the display portion 2705 and the display portion 2707, whereby a highly reliable electronic book reader can be provided. In the case of using a transflective or reflective liquid crystal display device as the display portion 2705, the electronic book reader may be used in a comparatively bright environment; therefore, a solar cell may be provided so that power generation by the solar cell and charge by a battery can be performed. When a lithium ion battery is used as the battery, there are advantages of downsizing and the like.

FIG. 8C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader may have a function of an electronic dictionary.

The electronic book reader may have a structure capable of wirelessly transmitting and receiving data. Through wireless communication, desired book data or the like can be purchased and downloaded from an electronic book server.

Figure 8D:
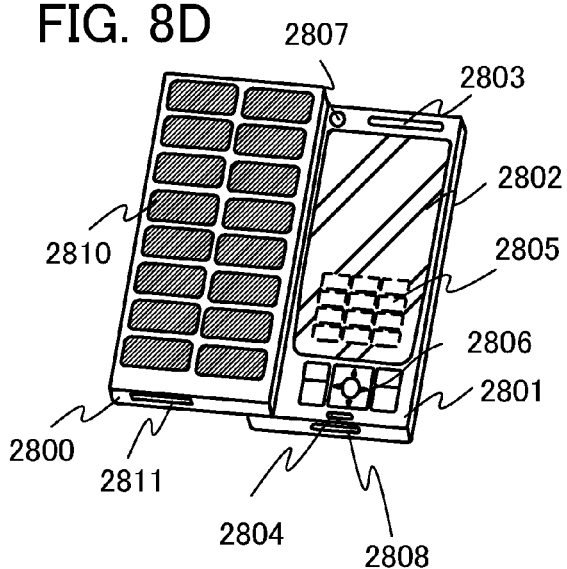

FIG. 8D illustrates a mobile phone, which includes two housings, i.e., a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. An antenna is incorporated in the housing 2801. By applying the semiconductor device described in any of the above embodiments to the display panel 2802, a highly reliable mobile phone can be provided.

Further, the display panel 2802 is provided with a touch panel. A plurality of operation keys 2805 which is displayed as images is illustrated by dashed lines in FIG. 8D. Note that a boosting circuit by which a voltage output from the solar cell 2810 is increased to be sufficiently high for each circuit is also provided.

On the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Furthermore, the housings 2800 and 2801 which are developed as illustrated in FIG. 8D can overlap with each other by sliding; thus, the size of the mobile phone can be decreased, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 8E:
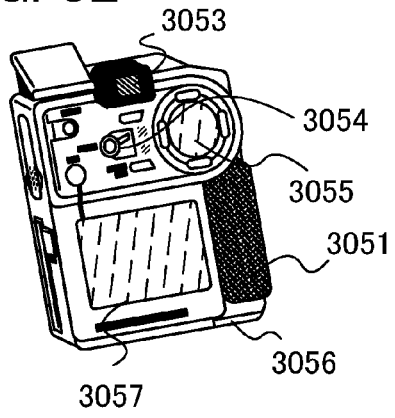

FIG. 8E illustrates a digital video camera which includes a main body 3051, a display portion A 3057, an eyepiece portion 3053, an operation switch 3054, a display portion B 3055, a battery 3056, and the like. By applying the semiconductor device described in any of the above embodiments to the display portion A 3057 and the display portion B 3055, a highly reliable digital video camera can be provided.

Figure 8F:
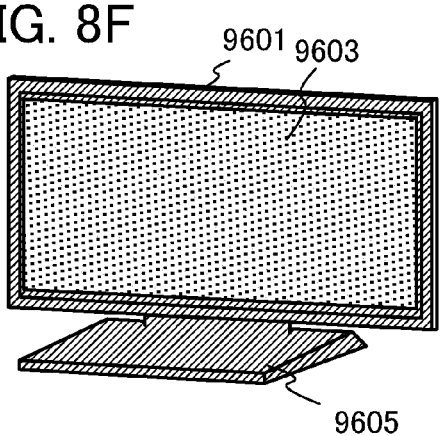

FIG. 8F illustrates an example of a television set. In the television set, a display portion 9603 is incorporated in a housing 9601. The display portion 9603 can display images. Here, the housing 9601 is supported by a stand 9605. By applying the semiconductor device described in any of the above embodiments to the display portion 9603, a highly reliable television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) data communication can be performed.

This embodiment can be combined with any of the other embodiments as appropriate.

Example

In this example, as an example of a metal oxide film which was able to be used in a semiconductor device according to one embodiment of the present invention, an aluminum oxide film was evaluated. Description is given with reference to FIGS. 9A and 9B, FIG. 10, FIGS. 11A and 11B, FIGS. 12A and 12B, FIGS. 13A and 13B, and FIGS. 14A and 14B. As the evaluation methods, X-ray reflectometry (XRR), secondary ion mass spectrometry (SIMS), and thermal desorption spectrometry (TDS) were used.

Figure 9A:
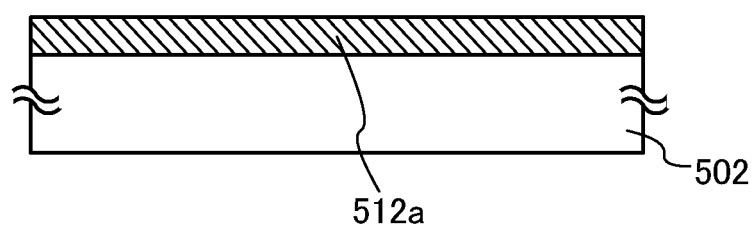
FIGS. 9A and 9B each illustrate an example of a metal oxide film of Example.
Figure 9B:
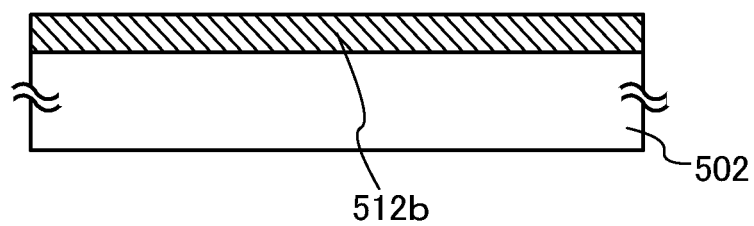

First, evaluation results of XRR are shown. FIGS. 9A and 9B each illustrate a structure of a sample used for the XRR.

The sample illustrated in FIG. 9A was obtained by forming a metal oxide film 512$a$ over a glass substrate 502. The sample illustrated in FIG. 9B was obtained by forming a metal oxide film 512$b$ over the glass substrate 502.

As the metal oxide film 512$a$, an aluminum oxide film was formed with a sputtering apparatus. The formation conditions of the metal oxide film 512$a$ were as follows: the substrate temperature was room temperature; $O_2$=50 sccm ($O_2$=100%); the power was 6 kW (pulsed DC power source, pulse=300 kHz); and the pressure was 0.4 Pa. Note that the film thickness was 100 nm. An aluminum target was used as a sputtering target.

As the metal oxide film 512$b$, an aluminum oxide film was formed with a sputtering apparatus. The formation conditions of the metal oxide film 512$b$ were as follows: the substrate temperature was 150° C.; $O_2$=300 sccm ($O_2$=100%); the power was 30 kW (AC power source); and the pressure was 0.7 Pa. Note that the film thickness was 100 nm. An aluminum target was used as a sputtering target.

The samples having the structures illustrated in FIGS. 9A and 9B are referred to as Samples 1 and 2, respectively. The film density of the aluminum oxide films of the samples was evaluated by the XRR. In the XRR, each of the samples was measured at three points. Further, the film density was evaluated on the assumption that the composition of the aluminum oxide film was an ideal composition: $Al_2O_3$ (Z/A=0.4882, (Z=atomic number, A=mass number)).

Figure 10:
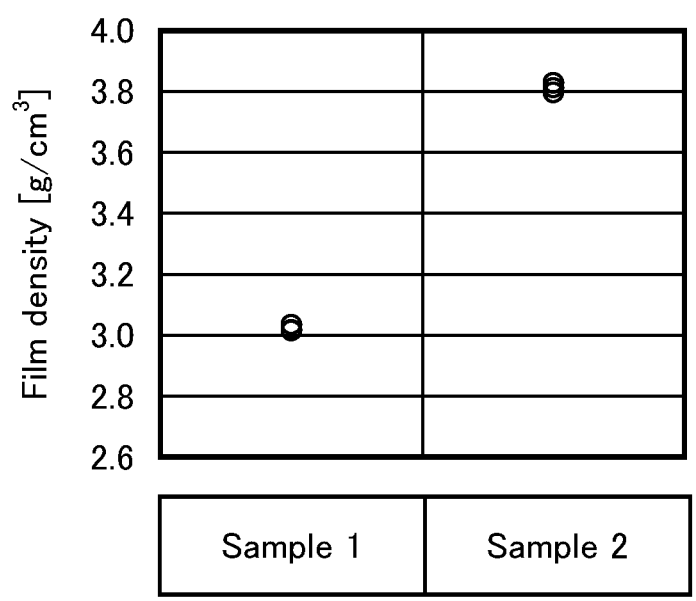
FIG. 10 shows measurement results of film density of an aluminum oxide film.

FIG. 10 shows the measurement results. As shown in FIG. 10, the film density of the aluminum oxide film of Sample 1 was approximately 3.0 g/cm$^3$, and the film density of the aluminum oxide film of Sample 2 was approximately 3.8 g/cm$^3$.

Figure 11A:
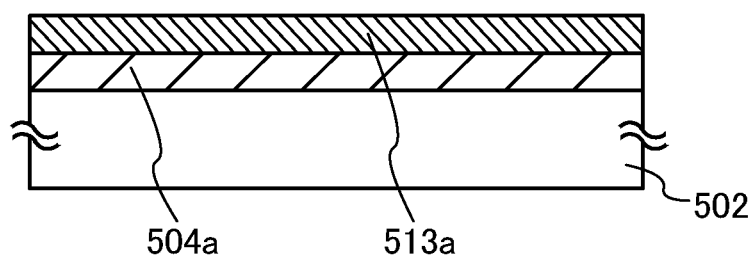
FIGS. 11A and 11B each illustrate an example of a metal oxide film of Example.
Figure 11B:
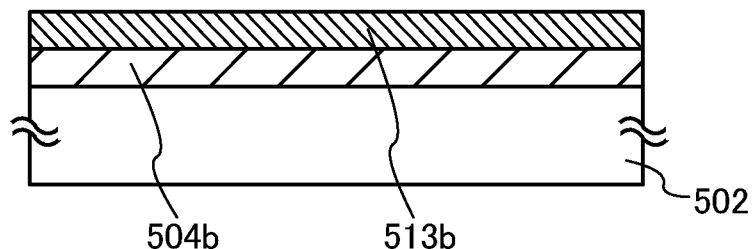

Next, evaluation by SIMS analysis is described. FIGS. 11A and 11B each illustrate a structure of a sample used for the SIMS analysis.

The sample for evaluation illustrated in FIG. 11A was obtained by forming a silicon oxide film 504a over the glass substrate 502 and forming a metal oxide film 513a over the silicon oxide film 504a. The sample for evaluation illustrated in FIG. 11B was obtained by forming a silicon oxide film 504b over the glass substrate 502 and forming a metal oxide film 513b over the silicon oxide film 504b. Note that the samples having the structures illustrated in FIGS. 11A and 11B are referred to as Samples 3 and 4, respectively.

The formation conditions of the silicon oxide film 504a were as follows: a sputtering method is used; the substrate temperature was 200° C.; $O_2$=50 sccm ($O_2$=100%); the power was 6 kW (pulsed DC power source, pulse=300 kHz); and the pressure was 0.4 Pa. Note that the film thickness was 100 nm.

The formation conditions of the silicon oxide film 504b were as follows: a sputtering method is used; the substrate temperature was room temperature; $O_2$=300 sccm ($O_2$=100%); the power was 6 kW (AC power source); and the pressure was 0.7 Pa. Note that the film thickness was 400 nm.

As the metal oxide film 513a, an aluminum oxide film was formed with a sputtering apparatus. The formation conditions of the metal oxide film 513a were as follows: the substrate temperature was room temperature; $O_2$=50 sccm ($O_2$=100%); the power was 6 kW (pulsed DC power source, pulse=300 kHz); and the pressure was 0.4 Pa. Note that the film thickness was 50 nm. An aluminum target was used as a sputtering target.

As the metal oxide film 513b, an aluminum oxide film was formed with a sputtering apparatus. The formation conditions of the metal oxide film 513b were as follows: the substrate temperature was 150° C.; $O_2$=300 sccm ($O_2$=100%); the power was 30 kW (AC power source); and the pressure was 0.7 Pa. Note that the film thickness was 100 nm. An aluminum target was used as a sputtering target.

Note that the film density of the aluminum oxide film of the metal oxide film 513a was set to 3.0 g/cm$^3$, and the film density of the aluminum oxide film of the metal oxide film 513b was set to 3.8 g/cm$^3$.

The structures of Samples 3 and 4 described above are shown in Table 1.

TABLE 1

| | Structure | Film density of aluminum oxide film [g/cm$^3$] |
|---|---|---|
| Sample 3 | glass\silicon oxide (100 nm)\aluminum oxide (50 nm) | 3.0 |
| Sample 4 | glass\silicon oxide (400 nm)\aluminum oxide (100 nm) | 3.8 |

A pressure cooker test (PCT) was performed on Samples 3 and 4 shown in Table 1. In the PCT in this example, Samples 3 and 4 were held for 100 hours under the following conditions: the temperature was 130° C.; the humidity was 85% (the volume ratio of water to deuterated water of water vapor contained in a gas is $H_2O$ (water):$D_2O$ (deuterated water)=3:1); and the pressure was 2.3 atm (0.23 MPa).

In this example, a "D atom", which is expressed by deuterium water or the like, expresses a hydrogen atom with a mass number of 2 ($^2H$).

As SIMS analysis of Samples 3 and 4 after the PCT, substrate side depth profile (SSDP) SIMS was used to measure the concentrations of hydrogen (H) atoms and deuterium (D) atoms in the films. The measurement results of Samples 3 and 4 are shown in FIGS. 12A and 12B, respectively.

It is known that it is difficult to obtain accurate data in the proximity of a surface of a sample or in the proximity of an interface between stacked films formed using different materials by the SIMS analysis in measurement principle. Thus, in the case where distributions of the concentrations of hydrogen (H) atoms and deuterium (D) atoms in the film in the thickness direction are analyzed by SIMS, an average value in a region where the film is provided, the value is not greatly changed, and an almost constant level of strength can be obtained is employed as the concentrations of hydrogen (H) atoms and deuterium (D) atoms.

Figure 12A:
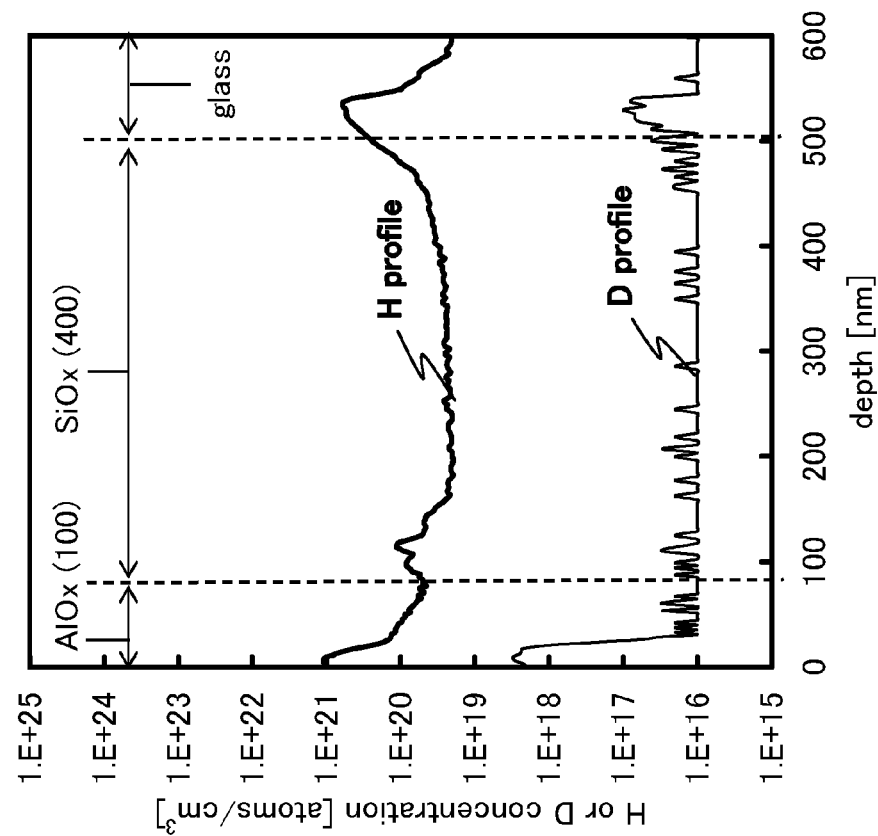
FIGS. 12A and 12B show measurement results of SIMS analysis.

FIG. 12A shows that the concentrations of hydrogen (H) atoms and deuterium (D) atoms in the silicon oxide film 504a of Sample 3 are $1.4 \times 10^{21}$ atoms/cm$^3$ and $2.9 \times 10^{20}$ atoms/cm$^3$, respectively.

Figure 12B:
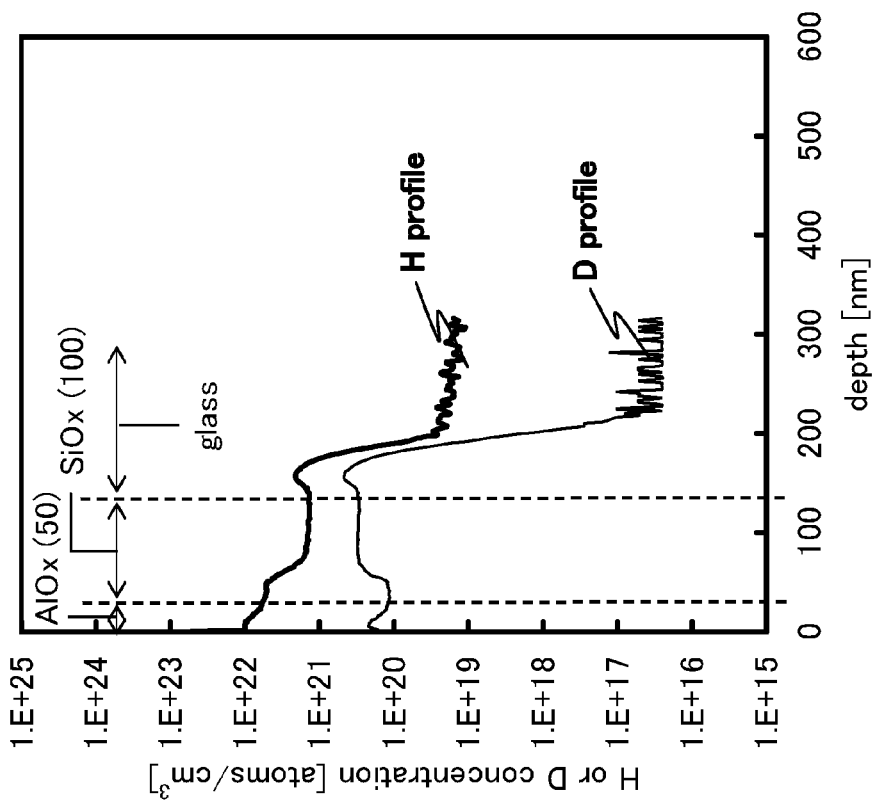

FIG. 12B shows that the concentration of hydrogen (H) atoms in the silicon oxide film 504b of Sample 4 is $2.2 \times 10^{19}$ atoms/cm$^3$ and the concentration of deuterium (D) atoms in the silicon oxide film 504b of Sample 4 is lower than or equal to a lower limit of detection. Note that the lower limit of detection of the concentration of deuterium (D) atoms by SIMS analysis in this example is $1.0 \times 10^{16}$ atoms/cm$^3$.

Note that all the results of SIMS analysis in this example were quantified using a standard sample of a silicon oxide film.

FIGS. 12A and 12B show that in Sample 3 which includes the aluminum oxide film of which a film density was set to 3.0 g/cm$^3$, hydrogen (H) atoms and deuterium (D) atoms pass through the aluminum oxide film and are diffused into the silicon oxide film. On the other hand, in Sample 4 which includes the aluminum oxide film of which a film density was set to 3.8 g/cm$^3$, diffusion of hydrogen (H) atoms and deuterium (D) atoms is suppressed in the aluminum oxide film. From Sample 4, in hydrogen (H) atoms and deuterium (D) atoms, the concentrations are drastically decreased in the aluminum oxide film at a depth of around 30 nm; thus, it can be said that the diffusion of hydrogen (H) atoms and deuterium (D) atoms can be suppressed even when the thickness of the aluminum oxide film is 50 nm, as in Sample 3.

As described above, it is founded that barrier properties of the aluminum oxide film to hydrogen (H) atoms and deuterium (D) atoms of the aluminum oxide film are varied depending on the film density of the aluminum oxide film.

Figure 13A:
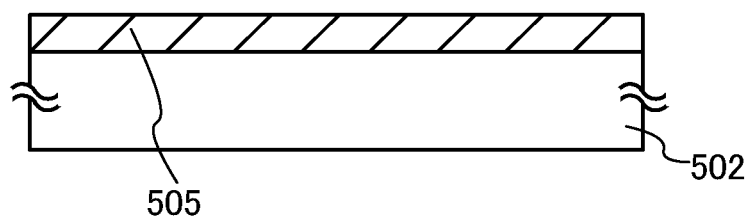
FIGS. 13A and 13B each illustrate an example of a metal oxide film of Example.
Figure 13B:
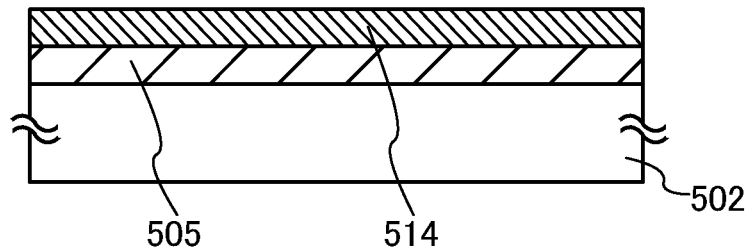

Next, evaluation by TDS analysis is described. FIGS. 13A and 13B each illustrate a structure of a sample used for the TDS analysis.

The sample illustrated in FIG. 13A was obtained by forming a silicon nitride film 505 over the glass substrate 502. The sample illustrated in FIG. 13B was obtained by forming the silicon nitride film 505 over the glass substrate 502 and forming an aluminum oxide film over the silicon nitride film 505 as a metal oxide film 514.

The formation conditions of the silicon nitride film 505 were as follows: a plasma CVD apparatus was used; the substrate temperature was 220° C.; and SiH$_4$=270 sccm, H$_2$=4000 sccm, and N$_2$O=2700 sccm. Note that the film thickness was 100 nm.

For the metal oxide film 514, an aluminum oxide film was formed with a sputtering apparatus. The formation conditions of the aluminum oxide film were as follows: the substrate temperature was 150° C.; O$_2$=300 sccm (O$_2$=100%); the power was 30 kW (AC power source); and the pressure was 0.7 Pa. Note that the film thickness was 100 nm.

Figure 14A:
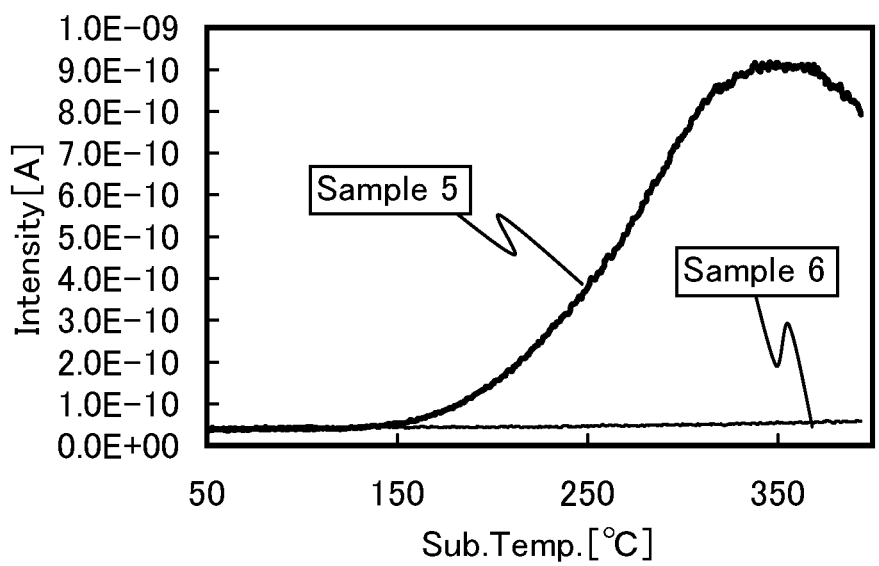
FIGS. 14A and 14B show measurement results of TDS analysis.
Figure 14B:
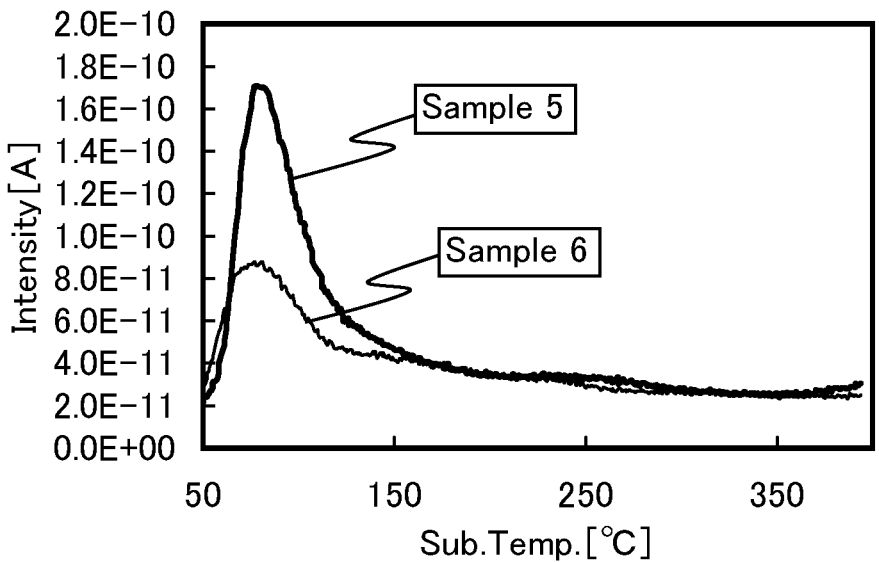

Note that the samples having the structures illustrated in FIGS. 13A and 13B are referred to as Samples 5 and 6, respectively, and TDS analysis was performed on Samples 5 and 6. FIG. 14A shows TDS results of the samples when m/z (m=mass, z=charge)=2 (H$_2$), and FIG. 14B shows TDS results of the samples when m/z=18 (H$_2$O). In FIGS. 14A and 14B, the horizontal axis represents substrate temperature and the vertical axis represents detection intensity.

FIG. 14A shows that Sample 5 has a peak at around 350° C. and hydrogen (H$_2$) is released. The released hydrogen is regarded as H$_2$ contained in the silicon nitride film 505. On the other hand, the intensity distribution in Sample 6 is substantially flat in the measurement range, and hydrogen (H$_2$) is not prominently detected. Accordingly, it is considered that the metal oxide film 514 suppresses release of H$_2$ contained in the silicon nitride film 505 to the outside.

FIG. 14B shows that Samples 5 and 6 each have a peak of H$_2$O at around 50° C. to 100° C., and this peak occurs because of absorbed moisture on a surface of the sample. When Sample 5 is compared with Sample 6, the amount of released H$_2$O in Sample 6 is smaller than that in Sample 5. It is indicated that there is a possibility that the amount of absorbed moisture on the surface of the sample was reduced when the metal oxide film 514 is an outermost surface.

As described above, a metal oxide film is formed over a silicon nitride film, so that even when moisture, hydrogen, or the like is contained in the silicon nitride film, release thereof can be suppressed by the metal oxide film.

This example can be combined with any of the embodiments as appropriate.

This application is based on Japanese Patent Application serial no. 2011-189717 filed with Japan Patent Office on Aug. 31, 2011, the entire contents of which are hereby incorporated by reference.

What is claimed is:

1. A semiconductor device comprising:
   an oxide semiconductor film over an insulating surface;
   a source electrode and a drain electrode over the oxide semiconductor film;
   an oxide insulating film over and in contact with the oxide semiconductor film, the source electrode, and the drain electrode; and
   a first metal oxide film over the oxide insulating film,
   wherein the first metal oxide film has a film density of higher than or equal to 3.2 g/cm$^3$, and
   wherein the first metal oxide film is a Ga—Zn-based oxide film.

2. The semiconductor device according to claim 1, further comprising a second metal oxide film in contact with the oxide semiconductor film.

3. The semiconductor device according to claim 1,
   wherein the first metal oxide film is a film including aluminum oxide.

4. The semiconductor device according to claim 1,
   wherein the oxide semiconductor film includes at least one of oxides of indium, zinc, gallium, zirconium, tin, gadolinium, titanium, and cerium.

5. A semiconductor device comprising:
   a gate electrode;
   a gate insulating film over the gate electrode;
   an oxide semiconductor film over the gate insulating film;
   a source electrode and a drain electrode over the oxide semiconductor film; and
   a protective film over the oxide semiconductor film, the source electrode, and the drain electrode,
   wherein the protective film is a stack in which a first metal oxide film is provided over an oxide insulating film,
   wherein the oxide insulating film is in contact with the oxide semiconductor film,
   wherein the first metal oxide film has a film density of higher than or equal to 3.2 g/cm$^3$, and
   wherein the first metal oxide film is a Ga—Zn-based oxide film.

6. The semiconductor device according to claim 5,
   wherein the first metal oxide film is a film including aluminum oxide.

7. The semiconductor device according to claim 5, further comprising a conductive film in contact with the first metal oxide film of the protective film.

8. The semiconductor device according to claim 7,
   wherein the conductive film includes at least one of zinc oxide, indium tin oxide, titanium oxide, aluminum, and titanium.

9. The semiconductor device according to claim 5,
   wherein the oxide semiconductor film includes at least one of oxides of indium, zinc, gallium, zirconium, tin, gadolinium, titanium, and cerium.

10. The semiconductor device according to claim 5, further comprising a second metal oxide film over and in contact with the gate insulating film.

11. The semiconductor device according to claim 5, further comprising a base insulating film under and in contact with the gate electrode,
    wherein the base insulating film includes a third metal oxide film in contact with the gate electrode, and
    wherein a film density of the third metal oxide film is higher than or equal to 3.2 g/cm$^3$.

* * * * *